(12) United States Patent (10) Patent No.: US 8,769,456 B1
Krishnan et al. (45) Date of Patent: Jul. 1, 2014

(54) METHODS, SYSTEMS, AND ARTICLES FOR IMPLEMENTING EXTRACTION AND ELECTRICAL ANALYSIS-DRIVEN MODULE CREATION

(75) Inventors: Prakash Krishnan, Wayne, NJ (US);
Jeremiah Cessna, Pittsburgh, PA (US);
Akshat Shah, Philadelphia, PA (US);
Keith Dennison, Edinburgh (GB)

(73) Assignee: Cadence Design Systems, Inc., San Jose, CA (US)

( * ) Notice: Subject to any disclaimer, the term of this patent is extended or adjusted under 35 U.S.C. 154(b) by 0 days.

(21) Appl. No.: 13/282,426

(22) Filed: Oct. 26, 2011

(51) Int. Cl.
*G06F 17/50* (2006.01)

(52) U.S. Cl.
USPC ............ 716/110; 716/106; 716/111; 716/112

(58) Field of Classification Search
USPC .................... 716/51, 106, 110, 111, 112, 119
See application file for complete search history.

(56) References Cited

U.S. PATENT DOCUMENTS

| | | | |
|---|---|---|---|
| 5,544,067 A | 8/1996 | Rostoker et al. | |
| 6,360,350 B1 | 3/2002 | Gabele et al. | |
| 7,392,255 B1 | 6/2008 | Sholtis et al. | |
| 7,587,694 B1 | 9/2009 | Henrickson et al. | |
| 7,949,987 B1 | 5/2011 | Ginetti et al. | |
| 8,265,918 B1 | 9/2012 | Neema et al. | |
| 2004/0261058 A1 | 12/2004 | Kundert | |
| 2006/0123377 A1* | 6/2006 | Schultz et al. | 716/11 |
| 2010/0050138 A1* | 2/2010 | Chidambarrao et al. | 716/5 |
| 2010/0083200 A1 | 4/2010 | Song et al. | |
| 2011/0107293 A1 | 5/2011 | Ganzhorn et al. | |
| 2011/0307854 A1 | 12/2011 | Lu et al. | |

OTHER PUBLICATIONS

Non-Final Office Action dated Sep. 13, 2013 for U.S. Appl. No. 13/282,177.
Pimentel et al. ("A Systematic Approach to Exploring Embedded System Architectures at Multiple Abstraction Levels", IEEE, 2006, pp. 99-112).
Chen et al. ("Formal Verification of Embedded System Designs at Multiple Levels of Abstraction",IEEE,2002,pp. 125-130).
Notice of Allowance dated Sep. 4, 2013 for U.S. Appl. No. 13/282,362.
Virtuoso® Analog Placer User Guide, Product Version 6.1.4, Nov. 2009.
Non-Final Office Action dated May 6, 2013 for U.S. Appl. No. 13/282,362.
Notice of Allowance dated Dec. 30, 2013 for U.S. Appl. No. 13/282,362.
Final Office Action dated Jan. 16, 2014 for U.S. Appl. No. 13/282,177.

* cited by examiner

*Primary Examiner* — Vuthe Siek
(74) *Attorney, Agent, or Firm* — Vista IP Law Group, LLP

(57) ABSTRACT

Various processes or modules described herein enable the schematic design tools to obtain physical data of a physical design and to perform one or more simulations in the schematic domain with such physical data such that the schematic design tools are made electrically aware of the physical data. Various types of data in the physical domain may be transferred to the schematic domain for the performance of one or more schematic simulations with the transferred data. The schematic designs are thus made electrically aware of such data from the physical domain and may incorporate any layout induced effects early in the schematic design stage or even at the time a schematic instance of a physical module is to be created in the schematic domain.

37 Claims, 14 Drawing Sheets

METHODS, SYSTEMS, AND ARTICLES FOR IMPLEMENTING EXTRACTION AND ELECTRICAL ANALYSIS-DRIVEN MODULE CREATION

CROSS-REFERENCE TO RELATED APPLICATION(S)

This Application is cross related to U.S. application Ser. No. 13/282,362, entitled "METHODS, SYSTEMS, AND ARTICLES FOR MULTI-SCENARIO PHYSICALLY-AWARE DESIGN METHODOLOGY FOR LAYOUT-DEPENDENT EFFECTS", and U.S. application Ser. No. 13/282,177, entitled "METHODS, SYSTEMS, AND ARTICLES OF MANUFACTURE FOR CREATING OR MANIPULATING ELECTRICAL DATA SETS FOR AN ELECTRONIC DESIGN". The content of both applications is hereby expressly incorporated by reference in its entirety.

BACKGROUND

The recent advances in very deep sub-micron (VDSM) integrated circuits (ICs) have brought new challenges in the physical design methodology process of integrated systems. In modern electronic circuits, geometries become smaller; clock frequencies increase; and on-chip interconnections gain increased importance in the prediction of performance. Nonetheless, it has been found that from 0.13 µm and bellow, the layout of an electronic design exhibits profound impacts on device electrical parameters, especially in sub-45 nm nodes. For example, stress effects caused by the length of oxide (LOD) definition or shallow trench isolation (STI) features impact the mobility ($\mu_{eff}$), carrier saturation velocity ($V_{sat}$), or threshold voltage ($V_{th}$) of metal-oxide-semiconductor (MOS) transistors. Well-proximity effect (WPE) also cause significant variation in the threshold voltages depending on the proximity of CMOS (complementary metal-oxide-semiconductor) transistors to an implant well boundary.

In addition, a typical design flow often uses various design rules and layout guidelines such as dummy components in module, well creation guidelines, device matching guidelines, etc. to minimize such layout dependent effects by verifying the physical design during sign-off via extraction and re-simulation through multiple iterations. If such verification fails, the design process reverts back to the layout or even back to the schematic design stage and repeats the schematic, layout, and verification process flow iteratively in order to meet a final layout with acceptable performance or manufacturing criteria.

Module creation constitutes a critical part of analog or analog and mixed signal design flows. In a typical module creation design flow, a schematic designer creates or combines multiple instances of one or more components, devices, nets, or parts of one or more nets (hereinafter "component") into a more complex, matched, and structured module. The schematic designer may, for example, specify how the one or more components are to be arranged, an interdigitation pattern, what and how one or more dummy devices are to be arranged, body contacts, or guard rings for the module. Once the schematic designer sets up how the module is to be created, the schematic designer may hand off these parameters to a layout designer who in turn use a module generation tool, a module compilation tool, or a module creation too (collectively "module creation tool") to create the physical module in a physical layout. The physical layout is then extracted, simulated, and verified to determine whether the physical layout meets circuit performance specifications.

Nonetheless, in technologies at process nodes 45 nm and below, the device placement and routing within these modules may significantly impact the performance or reliability of the electronic circuits. For example, insufficient wire widths within the physical module or a part of the entire layout associated with the physical module may lead to electro-migration violations that may negatively impact the reliability or performance of the electronic circuits.

Thus, there exists a need for implementing analysis-driven module creation and for implementing electrically aware simulation for an electronic design.

SUMMARY

Disclosed are a method, a system, and an article of manufacture for implementing analysis-driven module creation for an electronic design. In various embodiments, a schematic designer uses a schematic design tool to create a physical module or at least a partial layout associated with the physical module. In some embodiments, the physical module may comprise a parameterized block, cell, component, feature, device, etc. (collectively parameterized cell or parameterized block) of electronic circuitry. In these embodiments, the designers create or modify one or more instances of the physical module by inputting or varying various parameters.

In various embodiments, a designer may create or modify a physical module by specifying one or more physical module parameters. Some exemplary parameters may comprise geometric information such as width(s), length(s), orientation, alignment of various features, spacing between two features, pattern(s) of one or more features, or the total number of a feature in a cell instance, etc. It shall be noted that this list is not intended to be exhaustive, and that a parameterized cell may comprise or define other parameters. Some exemplary physical module parameter may include, for example but not limited to, physical parameters such as material properties, thermal properties, etc. which may affect the electrical behavior or the physical module or a portion of the physical layout associated with the physical module. In some embodiments, the method or the system performs various functions to achieve the intended purpose while there exists only a partial, incomplete layout of the entire electronic design. For example, the method or the system achieves its intended purposes while the partial, incomplete layout only includes a single net between a plurality of terminals or pins that is associated with the physical module.

It shall be noted that although some embodiments described herein encompass a parameterized cell or block, a substantially similar approach may also apply to other components that are not parameterized. In some embodiments, the method or the system may also comprise the respective process(es) or hardware module(s) for a non-parameterized component of an electronic circuit. It shall also be noted that the layout need not necessarily be a partial, incomplete layout; rather, at least one of the multiple layouts may include a complete layout of the entire electronic circuit design.

In various embodiments, a schematic designer may utilize a schematic design tool to create a schematic instance of the electronic circuit. A schematic simulator may operate with or may be integrated within the schematic design tool to perform one or more simulations in the schematic domain. A designer may initiate a module creation, generation, or compilation (collectively "module creation") session to create or modify a physical module in the schematic design. Various processes or modules described herein enable the schematic design tool and the schematic simulator to obtain physical data of the physical module or at least a partial, incomplete layout encompassing the physical module and to perform one or more simulations in the schematic domain with such physical data such that the schematic design tools are made electrically aware of the physical data.

In some embodiments, the schematic design tool and the schematic simulator are made electrically aware of the corresponding physical data during the module creation session of the physical module. In these embodiments, the schematic designer may input or vary the schematic design information (e.g., by inputting or varying one or more parameters of an instance of the physical module to be created), and various processes or modules described herein may take such schematic design information and create at least a partial, incomplete layout.

These processes or modules may then perform extraction on the partial, incomplete layout, characterize one or more electrical parasitics associated with the extraction results, characterize one or more electrical characteristics (e.g., current(s), voltage(s), current densities, etc.) based at least in part upon the one or more electrical parasitics, and perform various analysis to identify any potential issues during the module creation session when the physical module is being created. One advantage of these embodiments is that the schematic designer may catch any potential issues arising out of the physical module to be created based on the schematic designer's input and thus the schematic designer and the subsequent layout designer need not go through an iterative process or at least need not go through as many iterations between the schematic design stage, the physical design stage, and the verification stage of the electronic design flow.

In some embodiments, the physical data, the extracted data from at least the partial, incomplete layout, various electrical parasitics, various electrical characteristics, or various analysis results may be transferred to the schematic domain to enable the performance of one or more schematic simulations with the transferred physical data, extracted data from at least the partial, incomplete layout, various electrical parasitics, various electrical characteristics, or various analysis results.

In these embodiments, these one or more schematic simulations are made electrically aware of such data from the physical domain and may thus be able to incorporate any layout induced effects, such as but not limited to stress effects caused by the length of oxide (LOD) definition or shallow trench isolation (STI) features impact the mobility ($\mu_{eff}$), carrier saturation velocity ($V_{sat}$), or threshold voltage ($V_{th}$) of metal-oxide-semiconductor (MOS) transistors. Well-proximity effect (WPE) also cause significant variation in the threshold voltages depending on the proximity of CMOS (complementary metal-oxide-semiconductor) transistors to an implant well boundary early in the schematic design stage or even at the time a schematic instance of a physical module is to be defined and created in the schematic domain.

In various embodiments, the method for implementing analysis-driven module uses at least one processor or at least one processor core (collectively "processor"), each of which executes one or more threads, to perform a process, act, or action (collectively process or action) of identifying or receiving schematic electrical information from a result of schematic simulation generated by a schematic simulator for the electronic design. The method may further comprise the process for transferring the schematic electrical information in a schematic domain to a physical module creation session and the process for performing a physical module creation process in a physical domain for a physical module of the electronic design in the physical module creation session by using at least the schematic electrical information in some embodiments.

In some embodiments, the method may further include the process for handing off a module created by the physical module creation session to a physical design or verification process. In addition, the method may further comprise the process for identifying a parameter, wherein the parameter corresponds to the physical module or the physical module creation session, the process for identifying or determining electrical data for the at least the partial layout, and the process for extracting parasitic data or physical data for the at least the partial layout. In some embodiments, the physical module creation process comprising at least one of the process for generating the physical module for the electronic design based at least in part upon the parameter, the process for editing or modifying the physical module for the electronic design by using at least the parameter, wherein the physical module already exists prior to performance of the module creation process, and the process for performing one or more simulations in a schematic domain or in a physical domain in addition to a schematic simulation that produces the schematic simulation result.

In addition or in the alternative, the process for generating the physical module for the electronic design comprises at least one of the process for performing a physical layout process for the physical module in at least a partial layout of the electronic design based at least in part upon the parameter, the physical layout process comprises floorplanning, placement, or at least partial routing for the physical module, and the process for identifying a layout alternative for the physical module and using the layout alternative for the physical module to generate the at least the partial layout of the electronic design, wherein the layout alternative is predetermined prior to the act of performing the physical module creation process. In some embodiments, the method may further optionally comprise the process for performing an electrical analysis using at least the parasitic data or the physical data and the process for performing a fix for the physical module based at least in part upon an electrical analysis result.

In some of these embodiments, the method may further optionally comprise the process for reconfiguring the physical module based at least in part upon the fix for the physical module. In some embodiments, the process of identifying or determining the electrical data for the at least the partial layout may further comprise the process of mapping the schematic electrical information from the schematic simulation result to the physical domain by transforming the schematic electrical information from the schematic simulation result in a schematic namespace to a physical namespace in the physical domain. In some embodiments, the method may further optionally comprise the process of mapping at least some of the physical data or the parasitic data from the physical domain to a schematic domain, the process of transferring at least some of the physical data or the parasitic data, which have been mapped to the schematic domain, to the schematic simulator, and the process of re-performing the schematic simulation by using the at least some physical data or the parasitic data, which have been mapped.

In some embodiments, the process of performing the electrical analysis may comprise the process of identifying, determining, or updating physical data of or related to a partial layout including the physical module, the process of characterizing an electrical parasitic that is associated with the physical data, the process of characterizing an electrical characteristic that is associated with the electrical parasitic or the physical data, and the process of identifying or determining a constraint that is associated with the electrical characteristic. In some of these embodiments, the process of performing the electrical analysis may be performed during the module creation session. In addition or in the alternative, the process of performing the electrical analysis further comprises the process of ensuring correctness of the physical data or other data that are related to the constraint in some embodiments.

In some of these embodiments, the process of performing the electrical analysis may further optionally comprise the process of identifying or determining a net that is associated with the partial layout, the process of specifying a simulation parameter, an analysis point, or an analysis corner that is associated with the net, and the process of determining electrical data for the net by at least performing a simulation in the physical domain. In addition, the process of performing the electrical analysis may further optionally comprise the process of identifying thermal data associated with the partial layout and the process of updating the simulation parameter, the analysis point, or the analysis corner by using at least the thermal data. In some embodiments, the process of identifying, determining, or updating the physical data of or related to the partial layout including the physical module may comprise the process of reducing a total number of electrical parasitics to a first number of electrical parasitics, in which the total number is greater than the first number, and the process of mapping the physical data to the schematic domain.

In some of these embodiments, the process of identifying, determining, or updating the physical data of or related to the partial layout including the physical module may further optionally comprise the process of determining an adjustment to the physical data or the other data that are related to the constraint based at least in part upon a result of the action of ensuring the correctness of the physical data or the other data that are related to the constraint, the process of applying the adjustment to the physical data or the other data that are related to the constraint, and the process of ensuring the correctness of the physical data or other data that are related to the constraint based at least in part upon the adjustment. In some embodiments, the process of characterizing the electrical characteristic that is associated with the electrical parasitic or the physical data may comprise the process of identifying current information for the partial layout and the process of determining the electrical characteristic by using at least the current information and a solver process.

In some of these embodiments, the process of determining the electrical characteristic by using at least the current information and the solver process may comprise at least one of the process of determining whether an electro-migration related constraint is satisfied by determining a current density or a current for a shape by using the shape and the current information and the process of determining whether a voltage drop related constraint is satisfied by determining a first current for a first shape by using the shape and the current information. In some embodiments, the solver process may comprise the process of identifying or receiving the current information for the partial layout, the process of determining one or more voltages for the partial layout by using at least the current information, and the process of determining one or more current data for the partial layout by using at least the one or more voltages for the partial layout.

In some of these embodiments, the current comprises at least one of a maximum current or a maximum current vector in the partial layout, a transient current or a transient current vector at a first time point of a first plurality of time points in the partial layout, and an average current or an average current vector at a second time point of a second plurality of time points in the partial layout. In some embodiments, the process of re-performing the schematic simulation may comprise the process of identifying the result of schematic simulation that is generated by the schematic simulator and is related to the at least some of the physical data, the process of identifying, determining, or updating the at least some of the at least some of the physical data based at least in part upon the result of the schematic simulation, the process of characterizing an electrical parasitic that is associated with the at least some of the physical data, and the process of re-performing the schematic simulation by using at least a transformed version of the electrical parasitic.

In addition or in the alternative, the process of re-performing the schematic simulation may further comprise the process of synchronizing at least a partial physical design including the physical module and at least a schematic version of the partial physical design by transforming the electrical parasitic into the transformed version of the electrical parasitic in the schematic version, and the process of providing the transformed version of the electrical parasitic to the schematic simulator. In some of these embodiments, the process of re-performing the schematic simulation may further optionally comprise the process of comparing a result of the action of re-performing the schematic simulation with the result of schematic simulation and the process of determining an adjustment to the partial physical design based at least in part upon a comparison result of the action of comparing.

Some embodiments are directed at a method that uses at least one processor to perform various process implementing electrically aware simulation. In some embodiments, the method may comprise the process of initiating a module creation session that is to create a physical module, the process of extracting physical data from a partial layout of an electronic design that includes the physical module, the process of transferring the physical data to a schematic simulator, and the process of performing a layout-aware simulation with the physical data. In some embodiments, the process of extracting the physical data may comprise the process of determining a parameter for the physical module, and the process of determining a module creation parameter for the module creation process.

In some embodiments, the process of transferring the physical data to the schematic simulator may comprise the process of mapping the physical data from a physical domain to a schematic domain. In some embodiments, at least one of the action of extracting the physical data, the action of transferring the physical data, and the action of performing the layout-aware simulation is performed during a module creation session that creates the physical module or the partial layout including the physical module. In some embodiments, the partial layout includes one or more nets that are associated with the physical module but does not include a physical layout of the electronic design in its entirety.

In some embodiments, the process of performing the layout-aware simulation with the physical data may comprise the process of identifying, determining, or updating the physical data from the partial layout, the process of characterizing an electrical parasitic that is associated with the at least some of the physical data, and the process of performing the layout-aware simulation based at least in part upon the electrical parasitic. In some of these embodiments, the process of performing the layout-aware simulation with the physical data may further optionally comprise the process of characterizing an electrical characteristic based at least in part upon the electrical parasitic and the process of performing the layout-aware simulation based further at least in part upon the electrical characteristic.

In some of these embodiments, the process of performing the layout-aware simulation with the physical data may further optionally comprise the process of identifying a result of schematic simulation that is generated by the schematic simulator prior to initiation of the module creation session, the process of performing the action of identifying, determining, or updating the physical data from the partial layout further based at least in part upon a result of the schematic simulation, and the process of performing the layout-aware simulation to generate a first result of schematic simulation based further at least in part upon the physical data that are identified, determined, or updated further based at least in part upon the result of the schematic simulation. In some of these embodiments, the process of performing the layout-aware simulation with the physical data may further optionally comprise the process of comparing the result of the schematic simulation and the first result of schematic simulation to generate a comparison result, and the process of determining an adjustment to the partial physical design based at least in part upon the comparison result.

Some embodiments are directed at a hardware system that may be invoked to perform any of the methods, processes, actions, acts, or sub-processes disclosed herein. The hardware system may include at least one processor or at least one processor core, which executes one or more threads of execution to perform any of the methods, processes, acts, actions, or sub-processes disclosed herein in some embodiments. The hardware system may further include one or more forms of non-transitory machine-readable storage media or devices to temporarily or persistently store various types of data or information. Some exemplary modules or components of the hardware system may be found in the System Architecture Over section below.

Some embodiments are directed at an article of manufacture that includes a non-transitory machine-accessible storage medium having stored thereupon a sequence of instructions which, when executed by at least one processor or at least one processor core, causes the at least one processor or the at least one processor core to perform any of the methods, processes, acts, actions, or sub-processes disclosed herein. Some exemplary forms of the non-transitory machine-readable storage media may also be found in the System Architecture Over section below.

BRIEF DESCRIPTION OF THE DRAWINGS

The drawings illustrate the design and utility of various embodiments of the present invention. It should be noted that the figures are not drawn to scale and that elements of similar structures or functions are represented by like reference numerals throughout the figures. In order to better appreciate how to obtain the above-recited and other advantages and objects of various embodiments of the invention, a more detailed description of the present inventions briefly described above will be rendered by reference to specific embodiments thereof, which are illustrated in the accompanying drawings. Understanding that these drawings depict only typical embodiments of the invention and are not therefore to be considered limiting of its scope, the invention will be described and explained with additional specificity and detail through the use of the accompanying drawings in which.

DETAIL DESCRIPTION

Figure 1:
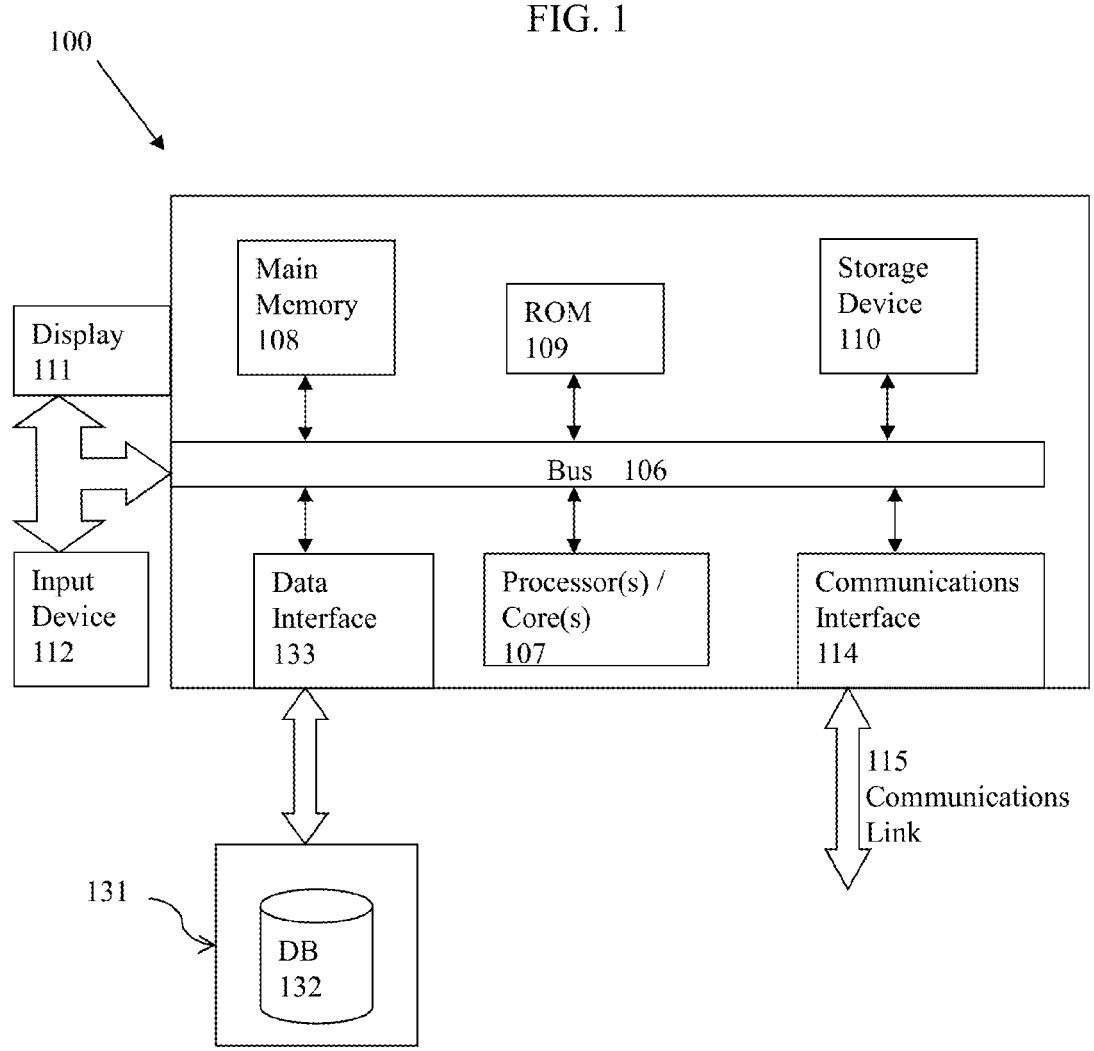
FIG. 1 depicts a computerized system on which a method for implementing extraction- and/or analysis-driven module creation may be implemented.

Various embodiments of the invention are directed to a methods, systems, and articles of manufacture for implementing electronic circuit designs with electro-migration awareness in a single embodiment or in some embodiments. Other objects, features, and advantages of the invention are described in the detailed description, figures, and claims.

Various embodiments will now be described in detail with reference to the drawings, which are provided as illustrative examples of the invention so as to enable those skilled in the art to practice the invention. Notably, the figures and the examples below are not meant to limit the scope of the present invention. Where certain elements of the present invention may be partially or fully implemented using known components (or methods or processes), only those portions of such known components (or methods or processes) that are necessary for an understanding of the present invention will be described, and the detailed descriptions of other portions of such known components (or methods or processes) will be omitted so as not to obscure the invention. Further, various embodiments encompass present and future known equivalents to the components referred to herein by way of illustration.

Disclosed are a method, a system, and an article of manufacture for implementing analysis-driven module creation for an electronic design. In various embodiments, a schematic designer uses a schematic design tool to create a physical module. In some embodiments, the physical module may comprise a parameterized block or a parameterized cell of electronic circuitry. In some embodiments, the method or the system performs various functions to achieve the intended purpose while there exists only a partial, incomplete layout of the entire electronic design. Nonetheless, it shall be noted that although some embodiments described herein encompass a parameterized cell or block, a substantially similar approach may also apply to other components that are not parameterized. In some embodiments, the method or the system may also comprise the respective process(es) or hardware module(s) for a non-parameterized component of an electronic circuit. It shall also be noted that the layout need not necessarily be a partial, incomplete layout; rather, at least one of the multiple layouts may include a complete layout of the entire electronic circuit design.

In various embodiments, a schematic designer may utilize a schematic design tool to create a schematic instance of the electronic circuit. A schematic simulator may operate with or may be integrated within the schematic design tool to perform one or more simulations in the schematic domain. A designer may initiate a module creation, generation, or compilation (collectively "module creation") session to create or modify a physical module in the schematic design. Various processes or modules described herein enable the schematic design tool and the schematic simulator to obtain physical data of the physical module or at least a partial, incomplete layout encompassing the physical module and to perform one or more simulations in the schematic domain with such physical data such that the schematic design tools are made electrically aware of the physical data.

In some embodiments, the schematic design tool and the schematic simulator are made electrically aware of the corresponding physical data during the module creation session of the physical module. In these embodiments, the schematic designer may input or vary the schematic design information (e.g., by inputting or varying one or more parameters of an instance of the physical module to be created), and various processes or modules described herein may take such schematic design information and create at least a partial, incomplete layout. These processes or modules may then perform extraction on the partial, incomplete layout, characterize one or more electrical parasitics associated with the extraction results, characterize one or more electrical characteristics (e.g., current(s), voltage(s), current densities, etc.) based at least in part upon the one or more electrical parasitics, and perform various analysis to identify any potential issues during the module creation session when the physical module is being created.

One advantage of these embodiments is that the schematic designer may catch any potential issues arising out of the physical module to be created based on the schematic designer's input and thus the schematic designer and the subsequent layout designer need not go through an iterative process or at least need not go through as many iterations between the schematic design stage, the physical design stage, and the verification stage of the electronic design flow.

Figure 2:
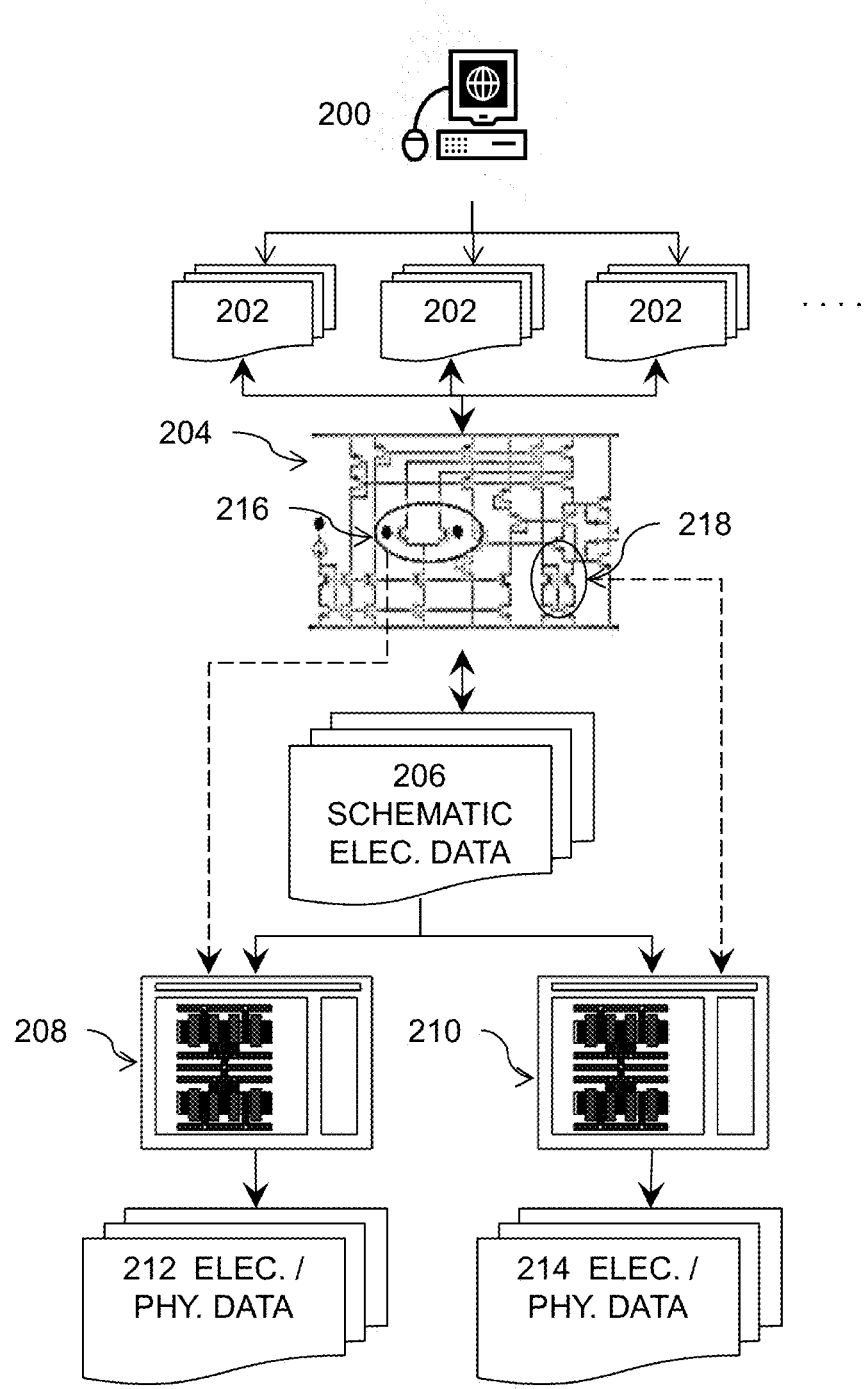
FIG. 2 illustrates a schematic flow diagram for a method or system for implementing extraction- and/or analysis-driven module creation in some embodiments.

FIG. 2 illustrates a schematic flow diagram for a method or system for implementing extraction and analysis-driven module creation in some embodiments. In some embodiments, the method or the system illustrated in FIG. 2 uses a computing system (200) to gather the simulation results (202) from a schematic design or simulation tool for a design under test (DUT) (204). The schematic design of the design under test 204 includes two schematic instances 216 and 218 for two modules that are to be created in the electronic design by, for example, launching or initiating one or more module creation sessions for the two instances 216 and 218 in some embodiments.

In this exemplary implementation illustrated in FIG. 2, a first module creation session 208 is initiated for the first module 216, and a second module creation session 210 is initiated for the second module 218 in some embodiments. It shall be noted that any number of sessions may be initiated for the creation of any number of modules for the same schematic design. The schematic electrical data or information 206 (e.g., current(s) on terminal(s) or pin(s), voltage(s) at various nodes in one or more nets, etc.) may be determined from the schematic design 204 by, for example, performing one or more schematic simulations for the schematic design of the design under test in some embodiments.

In some embodiments, information may refer to meaning of data as it is intended to be interpreted or knowledge concerning some facts, subjects, or events and may comprise processed data. In some embodiments, data may refer to any computer readable item that is known or assumed as fact and may comprise unprocessed information. In this disclosure, the term "information" and the term "data" may be used interchangeably unless otherwise specifically indicated. The method or the system may transfer the electrical data or information to the module creation sessions 208 and 210 for the respective modules that are being created or modified or are to be created or modified in some embodiments.

In some embodiments, the method or the system transferring the electrical data or information may further handle the mapping from the schematic domain (e.g., a schematic namespace in the schematic domain) to physical domain (e.g., a module creation layout namespace.) In some embodiments, the mapping may include 1: N correspondence between a schematic instance and the corresponding layout instances of a physical module. A module creation session (e.g., 208 or 210 in FIG. 2) may create one or more instances of the physical module or even perform some partial routing to create at least a partial, incomplete layout which may be further extracted to obtain various electrical parasitics (e.g., resistances, capacitances, inductances, etc.), various physical data (e.g., geometric information of various shapes, interconnects, etc., thermal data, etc.), or electrical data (e.g., various types of currents such as average currents, peak currents, transient currents, root mean square currents, etc., voltages, current densities, etc.).

For example, the method or the system may, during the module creation session, identify a net between terminals or pins and perform some internal routing for the physical module to generate a partial, incomplete layout. It shall be noted that the method or the system is not limited to operating on only a partial, incomplete layout but may also generate a complete layout for the entire electronic design at hand in some other embodiments. In some embodiments, the extraction engine may be integrated into various physical design tools such that the method or the system may perform various functions seamlessly without leaving the physical design environment. In some embodiments, the extraction engine may comprise a separate tool that operates seamlessly with the schematic design tools to perform various functions described herein.

The method or the system may further invoke one or more analysis engines (not shown) to perform various analyses based at least in part upon the data 212 or 214. For example, the method or the system may invoke an electro-migration engine to analyze at least the partial, incomplete layout associated with the physical module to determine whether certain portion of the partial, incomplete layout violates the electro-migration constraints or requirements. For example, the method or the system may invoke a voltage drop (IR drop) engine to analyze at least the partial, incomplete layout associated with the physical module to determine whether certain portion of the partial, incomplete layout meets the voltage drop constraints or requirements. For example, the method or the system may invoke a constraint verification engine to analyze at least the partial, incomplete layout associated with the physical module to determine whether certain portion of the partial, incomplete layout violates certain constraints.

Figure 3:
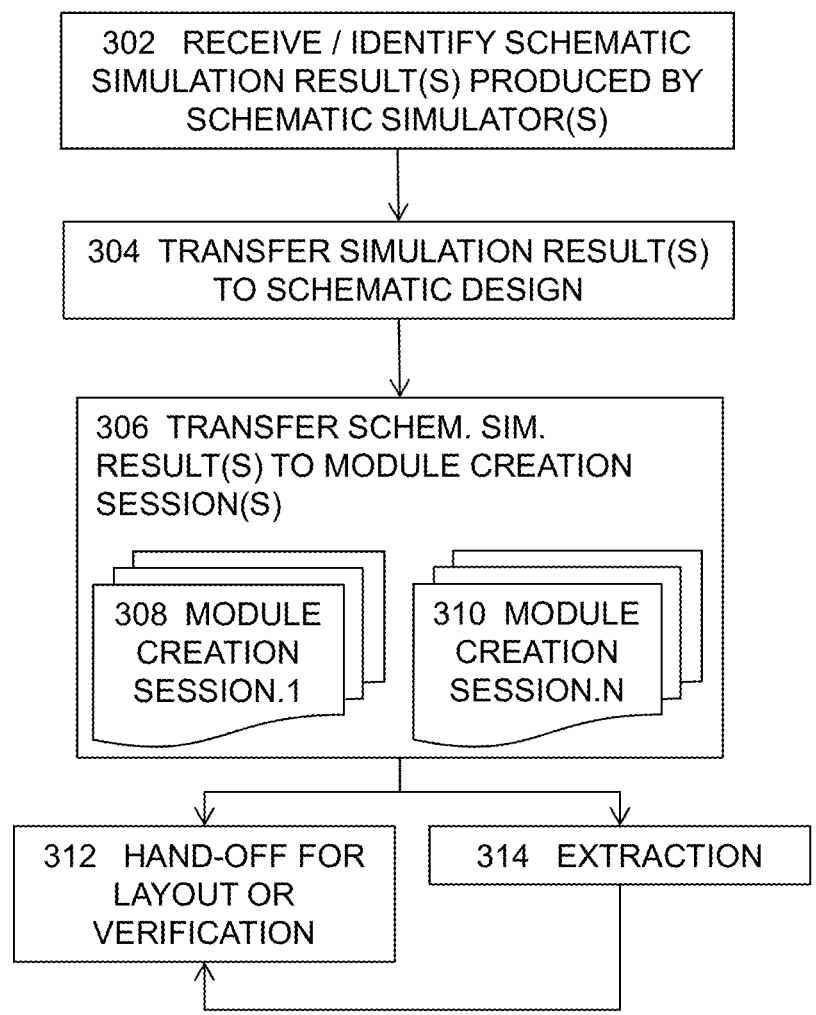
FIG. 3 illustrates a high level flow diagram for a method or system for implementing extraction- and/or analysis-driven module creation in some embodiments.

FIG. 3 illustrates a high level flow diagram for a method or system for implementing extraction- and/or analysis-driven module creation in some embodiments. In one or more embodiments, the method or the system for implementing extraction- and/or analysis-driven module creation may utilize a computing system 300 that includes at least one processor to perform various processes. In some embodiments, the method or the system may comprise the respective process or hardware module 302 for identifying or receiving one or more schematic simulation results that are generated by one or more schematic simulators. In some embodiments, the method or the system may comprise the respective process or hardware module 304 for transferring the one or more schematic simulation results to the schematic design for a design under test (DUT).

In some embodiments, the one or more schematic simulation results include electrical information such as, but not limited to, various types of currents on one or more terminals, pins, or nodes, various voltages on one or more nets or a portion thereof, etc. that are related to the physical module that is being created or modified or is to be created or modified in some embodiments. In some embodiments, the method or the system may comprise the respective process or hardware module 306 for transferring the one or more schematic simulation results to one or more respective module creation sessions.

In some embodiments, the method or the system transfers only a smaller portion of the one or more schematic simulation results to the corresponding module creation session(s) (e.g., module creation session.1 308 or the module creation session.N 310) such that the corresponding module creation session(s) to perform its (their) intended functions. Each of the physical module creation session may be used to create one or more instances of the physical module or to modify one or more existing instances of physical modules. For example, the method or the system may transfer a part of the one or more schematic simulation results for the part of the schematic design within a predetermined radius of influence from the physical module to the corresponding physical module creation session.

In some embodiments, the method or the system may transfer the one or more schematic simulation results in their entirety to each physical module creation session. In some embodiments, the method or the system may comprise the respective process or hardware module 312 for handing off the results of the physical module creation session(s) for layout or verification. In some embodiments, the method or the system may comprise the respective process or hardware module 314 for performing extraction on the result of the physical module creation session(s). For example, the method or the system may extract various geometries or module parameters to determine layout dependent effects or electrical parasitics.

Figure 4A:
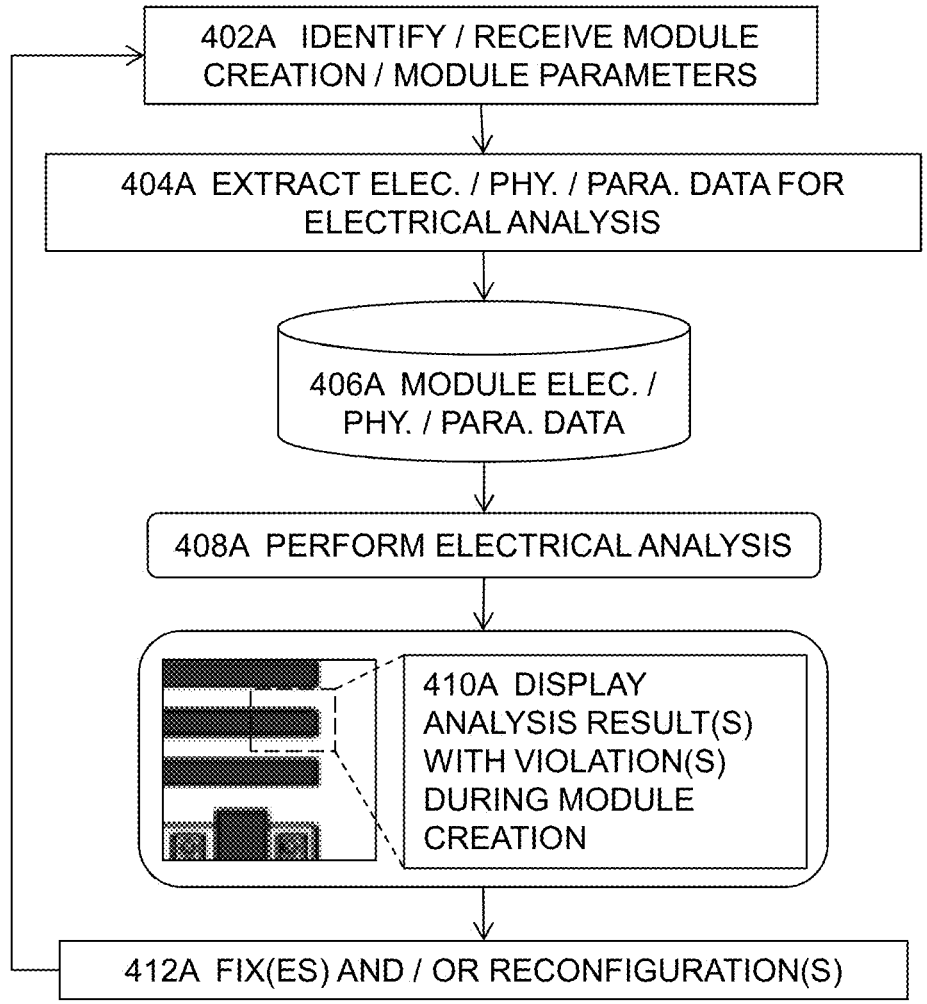
FIG. 4A illustrates a schematic flow diagram for a method or system for implementing electrically-aware module creation in some embodiments.

FIG. 4A illustrates a schematic flow diagram for a method or system for implementing electrically-aware module creation in some embodiments. In some embodiments, the method or the system may utilizes or comprises a computing system to identify or receive one or more module creation parameters or one or more module parameters at 402A. In some embodiments, the method or the system may comprise the respective process or hardware module 404A for extracting electrical data, physical data, or electrical parasitics for one or more electrical analyses. In some embodiments, the method or the system may comprise the respective process or hardware module 406A for storing the extracted electrical data, physical data, or electrical parasitics in a temporary or a persistent computer accessible storage medium.

In some embodiments, the method or the system may comprise the respective process or hardware module 408A for performing the one or more electrical analyses such as an electro-migration analysis, an IR-drop analysis, a constraint verification, or a re-simulation in the schematic domain with the identified or updated physical or electrical data or parameters. In some embodiments, the method or the system may optionally comprise the respective process or hardware module 410A for displaying the result of the one or more electrical analyses. In some embodiments, the method or the system uses a color scheme with multiple colors to display the analysis results.

For example, the method or the system may textually or graphically display a component in different colors where an electrical characteristic of the component is determined to exceed, by a certain degree, certain predetermined values from, for example, the specification, one or more constraint, or one or more design rules. For example, the method or the system may illustrate an interconnect or a terminal in red where the current or current density of the interconnect is determined to have exceeded, for example, 120% of the allowable maximum current or maximum current density from an electro-migration constraint. In this example, the method may further display an interconnect or a terminal in orange where the current or current density of the interconnect is determined to fall within 100%-120% of the allowable maximum current or maximum current density from an electro-migration constraint.

In addition, the method may further display an interconnect or a terminal in green where the current or current density of the interconnect is determined to fall below 100% of the allowable maximum current or maximum current density from an electro-migration constraint. In some embodiments, the method or the system may further provide the functionality for a user to group all the components with the same color coding such that the user may view the components whose electrical characteristics are determined to exceed certain predetermined values. In some embodiments, the method or the system may further invoke the physical design tool (e.g., a layout tool) to graphically or textually display a particular component that the user has identified.

For example, the user identify a particular interconnect (e.g., by clicking on the interconnect in the user interface) whose current density is determined to have exceeded a predetermined value, and the method or the system may respond to the user's identification by showing in either the same user interface or in a different user interface or a pop-up display to graphically or textually illustrate the component in the physical design. In some embodiments, the method or the system may comprise the respective process or hardware module 412A for performing one or more fixes or one or more reconfigurations based on the results of the electrical analyses. In some embodiments, the method or the system may further loop back to 402A after the performance of the one or more fixes or one or more reconfigurations and repeat the extraction, electrical analysis, etc. to ensure that the design meets various requirements, design rules, or constraints.

Figure 4B:
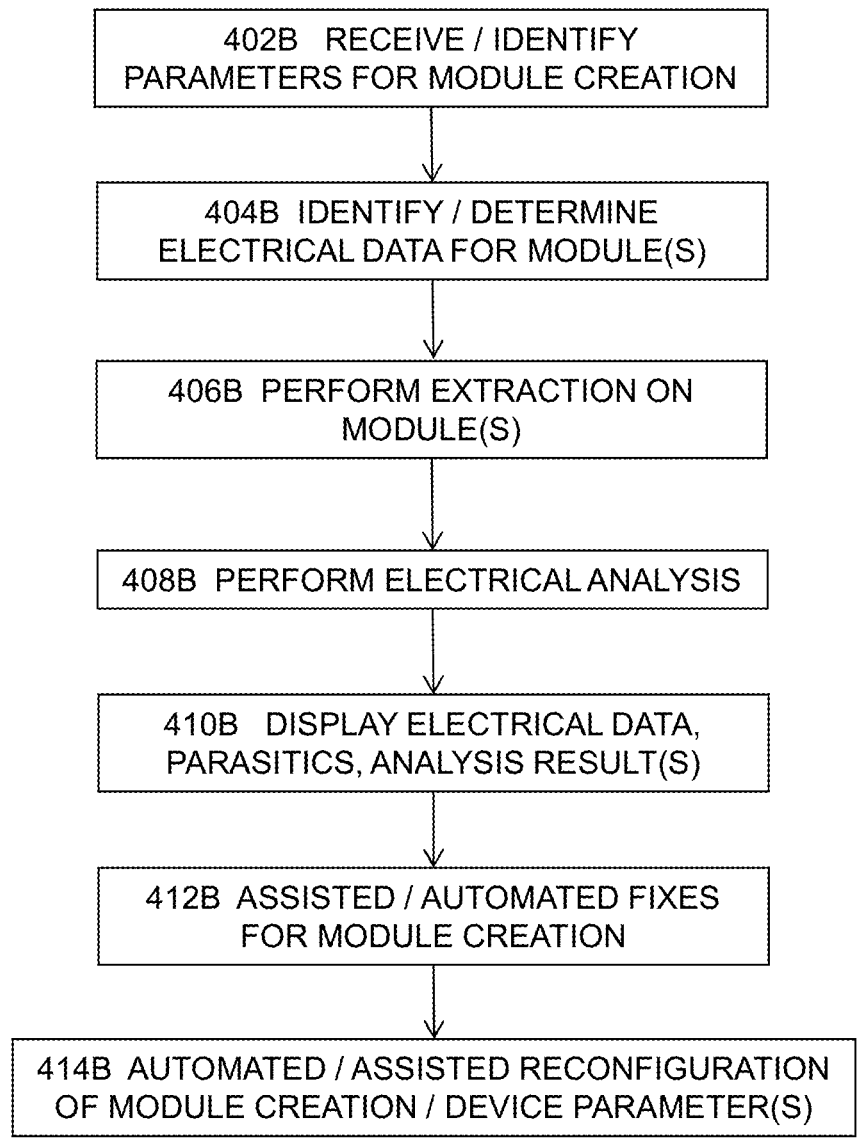
FIG. 4B illustrates a high level flow diagram for a method or system for implementing electrically-aware module creation in some embodiments.

FIG. 4B illustrates a high level flow diagram for a method or system for implementing electrically-aware module creation in some embodiments. In one or more embodiments, the method or the system for implementing electrically-aware module creation comprises the respective process or hardware module 402B of identifying or receiving one or more parameters for module creation. In some embodiments, the one or more parameters comprise, for example but not limited to, one or more device properties, one or more parameters for component description, or one or more parameters for the physical module that represents an instance of a parameterized cell. In addition or in the alternative, the one or more modules may comprise, for example but not limited to, inter-digitation pattern(s), dummy device(s), body contact(s), guard ring(s), abutting component(s), custom device spacing, routing criteria or style(s), the right-well-edge-distance parameter, or any other parameters that may affect physical module.

In some embodiments, the method or the system may further comprise the respective process or hardware module 404B of identifying or determining electrical data of the physical module. The electrical data may comprise, for example, various types of currents, voltages, etc. in some embodiments. In addition or in the alternative, the electrical data may be identified or determined from one or more sets of results of schematic simulations. For example, in some embodiments, the method or the system identifies or determines the electrical data by using at least some of the schematic simulation results and some physical data of at least a partial, incomplete layout associated with the physical module. In some of these embodiments, the method or the system may further identify a net associated with the physical module or perform partial routing within or for the physical module to identify the physical data.

In some embodiments, the method or the system may further comprise the respective process or hardware module 406B of performing extraction on the physical module or at least a partial layout associated with the physical module. In some embodiments, the method or the system may extract various physical data such as the geometric information of various shapes or components of the physical module or at least the partial layout associated with the physical module. In some embodiments, the method or the system may further determine additional information based at least in part upon the physical data.

For example, the method or the system may further identify or determine some parasitic data based on the geometric information extracted in some embodiments. As a practical example, the method or the system may extract the length, width, and thickness of an interconnect and determine the resistance of the interconnect by using the extracted geometric information and the resistivity information for the particular material of the interconnect with some additional computation. In some embodiments, the method or the system may further comprise the respective process or hardware module 408B of performing one or more electrical analyses by using the result of extraction. For example, the method or the system may determine various forms of electrical currents (e.g., peak current, average current, RMS current, or transient current at various time points, etc.) at various terminals, pins, or nodes, various voltages along one or more nets, etc. in the physical module or in the at least a partial layout associated with the physical module.

In some embodiments, the method or the system may further comprise the respective process or hardware module 4108 of displaying the results of the one or more electrical analyses, electrical parasitics, or some electrical data on a display apparatus. In some embodiments, the method or the system uses a color scheme with multiple colors to display the analysis results. For example, the method or the system may textually or graphically display a component in different colors where an electrical characteristic of the component is determined to exceed, by a certain degree, certain predetermined values from, for example, the specification, one or more constraint, or one or more design rules. In these embodiments, the method or the system thus provides guidance to a designer as to which parts of the physical module or at least a partial layout associated with the physical module needs to be modified or recreated in order to fix certain issues.

In some embodiments, the method or the system may further comprise the respective process or hardware module 412B of performing one or more assisted or automated fixes for module creation. In addition or in the alternative, the method or the system may further comprise the respective process or hardware module 414B of performing one or more automated or assisted reconfigurations of one or more module creation parameters or one or more device parameters in some embodiments. For example, the method or the system may reconfigure some module creation parameters in order to re-create the physical module or at least a partial layout associated with the physical module in some embodiments.

Figure 5A:
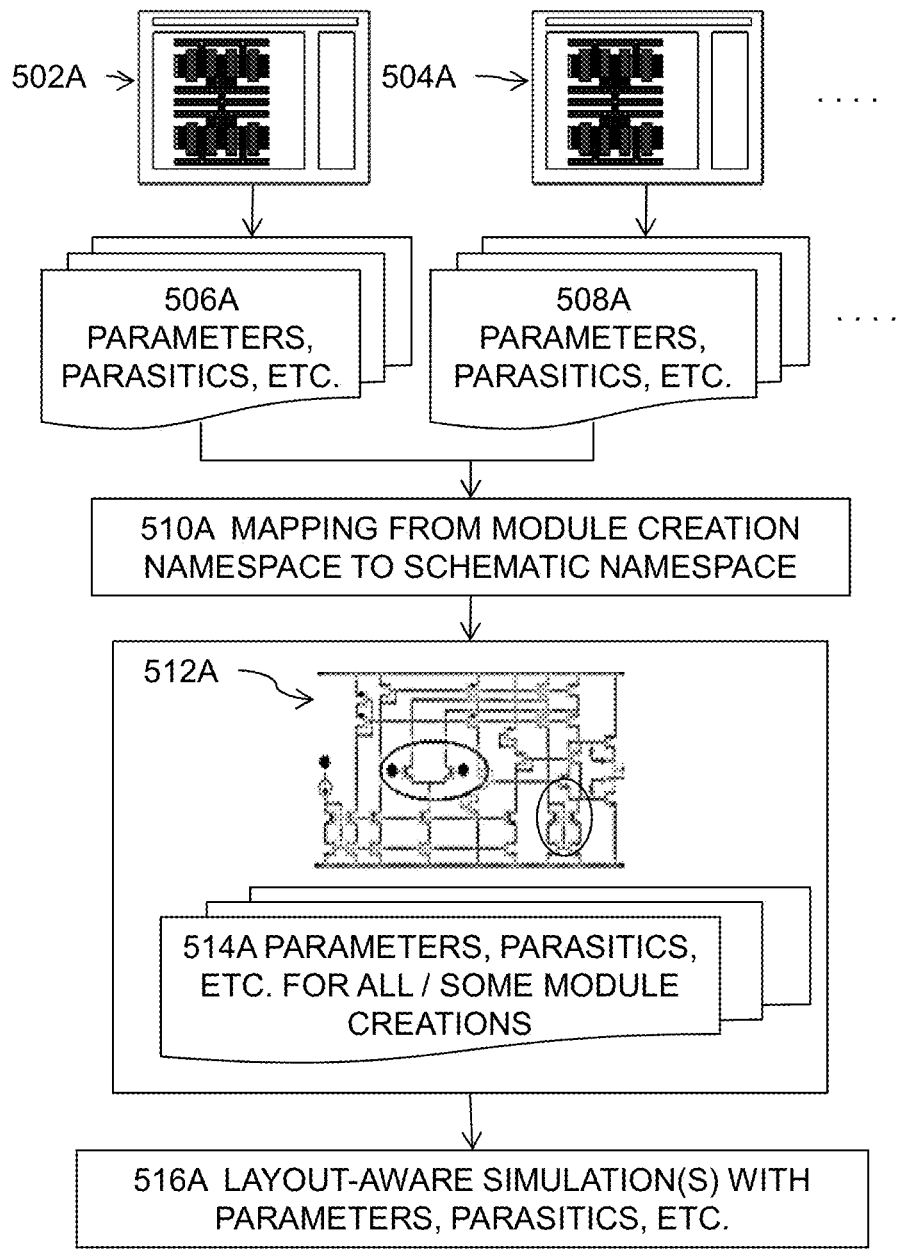
FIG. 5A illustrates a schematic flow diagram for a method or a system for implementing layout-aware simulations in some embodiments.

FIG. 5A illustrates a schematic flow diagram for a method or a system for implementing layout-aware simulations in some embodiments. In some embodiments, the method or the system utilizes or comprises a computing system that includes at least one processor executing one or more threads of execution to identify or determine one or more parameters or electrical parasitics (506A, 508A, etc.) about one or more instances for each of one or more physical modules (502A, 504A, etc.) from the corresponding one or more physical module creation sessions. In some of these embodiments, the method or the system may further comprise the respective process or hardware module 510A to map, convert, or transform (hereinafter map) the one or more parameters or electrical parasitics from the physical domain to the schematic domain.

For example, the method or the system may map the one or more parameters or electrical parasitics from a physical namespace to a schematic namespace in some embodiments. The method or the system may further comprise the process or hardware module 512A of transferring at least some of the one or more parameters or electrical parasitics that have been mapped (514A) from the one or more physical module creation sessions to a schematic design tool 512A in some embodiments. In some embodiments, the method or the system may further comprise the process or hardware module 516A to perform one or more layout-aware or electrically aware simulations with the one or more parameters or electrical parasitics that have been mapped.

In these embodiments, the method or the system captures the one or more layout-dependent parameters or electrical parasitics that may affect the physical module(s) or at least a partial, incomplete layout associated with the physical module(s). It shall be noted that the terms "layout aware" and "electrically aware" may be used interchangeably in some embodiments described herein unless otherwise indicated. In addition, the method or the system enables a designer to perform layout-aware simulations during one or more physical module creation sessions, during which corresponding physical module(s) are to be or are being created, by using the one or more parameters or electrical parasitics.

In some embodiments, the method or the system transfers the one or more parameters or electrical parasitics to the original schematic design and handles the mapping from the physical namespace to the schematic namespace including an N:1 correspondence between the physical module instances and the corresponding schematic instance. In some embodiments, the one or more parameters or electrical parasitics identified or determined from the module creation session(s) may be transferred to a layout-aware simulation environment which may further perform one or more schematic simulations on the original schematic design by stitching the one or more parameters or electrical parasitics into the original schematic design. In some embodiments, the method or the system stitches in critical components or parasitics along with other schematic devices or parasitic estimates. In some embodiments, the method or the system may enable a designer to continue to use the same test-bench that was previously used for schematic simulation purposes. In some embodiments, the method or the system may capture and/or simulate individual fingers or other individual components in a physical module as separate instances.

Figure 5B:
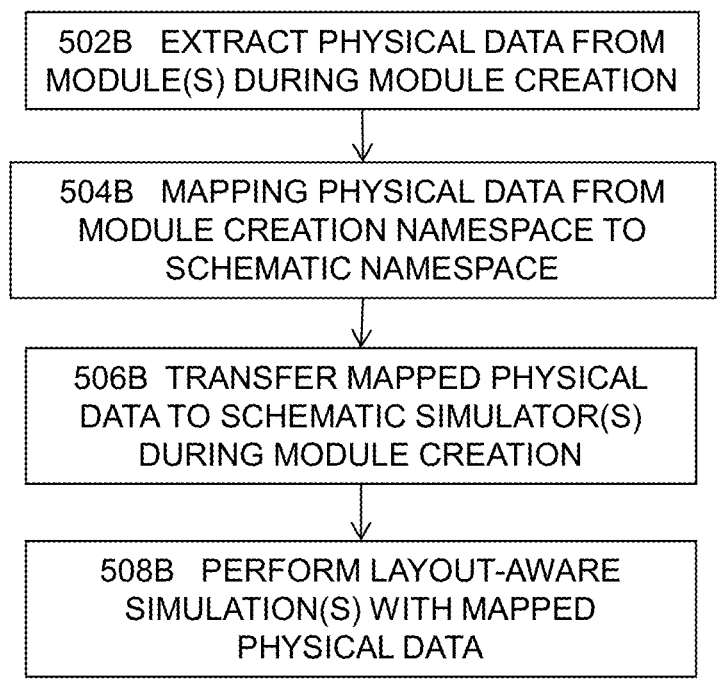
FIG. 5B illustrates a high level flow diagram for a method or a system for implementing layout-aware simulations in some embodiments.

FIG. 5B illustrates a high level flow diagram for a method or a system for implementing layout-aware simulations in some embodiments. More specifically, FIG. 5B illustrates a flow diagram where the method or the system may utilize or comprise a computing system to perform certain actions that comprise the respective process or hardware module 502B of extracting physical data from one or more physical modules or from one or more layouts associated with the corresponding one or more physical modules in some embodiments. In some of these embodiments, the one or more layouts comprise at least a partial, incomplete layout that includes, for example but not limited to, a physical module, a net associated with the physical module, and some but not complete routing within the physical module or the net.

In some embodiments, the process for extracting physical data may be invoked from or may be integrated within a physical design tool or flow, such as a layout editor, while the designer is implementing or modifying the physical design of the electronic circuit rather than from a post-layout verification tool or flow. In some embodiments, the process for extracting physical data may be invoked from or may be integrated within a physical design tool or flow, such as a layout editor, while the designer is implementing or modifying the physical design of an electronic circuit to aid the designer in creating or modifying the physical design of the electronic circuit.

In various embodiments describe herein, the physical data may be related to a net, which comprises one or more wires or interconnects connecting various other components together in an electronic circuit design. In some embodiment, the physical data may be related to a single component in the physical design (e.g., a layout) of the electronic circuit. For example, the method or the system may be applied to determine whether an interconnect segment complies with one or more simulation related constraints or performance expectations. In this example, the physical data may comprise, for example, the width, the length, the cross-sectional area along the segment, overlap of a metal object and via object, etc.

In some embodiments, the physical data may be related to a device, which comprise, for example, physical layers of materials with specific geometric dimensions, a source, gate and a drain. A device may be, for example, a field-effect transistor. In this example, the physical data may comprise the description of physical device layers and geometric descriptions that define the gate, source and drain regions. The physical data may also include the placement of electrical contacts to connect the device to interconnect wiring. In various embodiments, the physical data may further comprise the material and its associated physical (e.g., physical or electrical) attributes. For example, the physical data for a wire segment may comprise the material (e.g., Copper, Aluminum, Tungsten, etc.), one or more physical attributes, such as the electrical resistivity.

In some embodiments, the physical data may further comprise one or more electrical parasitics (e.g., one or more capacitances) or one or more electrical characteristics (e.g., various forms of currents at various terminals or nodes, various voltages along one or more nets, etc.). In some embodiments, the physical data may further comprise various parameters of a physical module that may further comprise, for example but not limited to, one or more device properties, one or more parameters for component description, one or more parameters for the physical module or at least a partial, incomplete layout associated with the physical module, or any parameters that are within, relating to, or associated with the physical module or at least a partial layout associated with the physical module. In addition or in the alternative, the physical data may comprise one or more parameters of, for example but not limited to, interdigitation pattern(s), dummy device(s), body contact(s), guard ring(s), abutting component(s), custom device spacing, routing criteria or style(s), right-well-edge-distance parameter, etc.

In some embodiments, the method or the system may further comprise the process or module 504B of mapping the physical data from a physical domain to a schematic domain. For example, the method or the system may map the physical data from a physical namespace to a schematic namespace in some embodiments. In some embodiments, the method or the system may further comprise the process or module 506B of transferring the mapped physical data to a schematic simulator. In some of these embodiments, the method or the system may transfer the mapped physical data to a schematic simulation during the same physical module creation session where the physical module or at least a partial layout associated therewith is being created. In some embodiments, the method or the system may further comprise the process or module 508B of performing one or more layout-aware simulations with the mapped physical module. In some of these embodiments, the method or the system may perform the one or more layout-aware simulations during the same physical module creation session where the physical module or at least a partial layout associated therewith is being created.

Figure 6A:
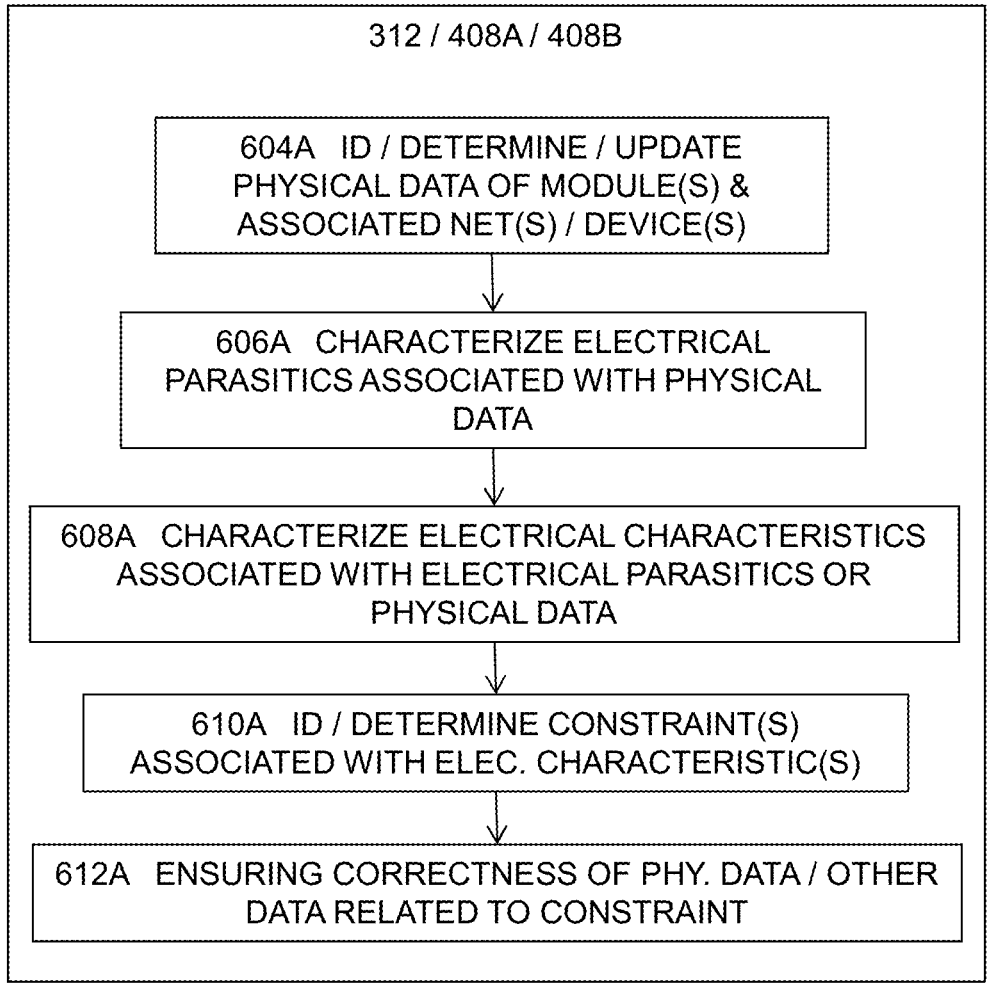
FIG. 6A illustrates more details about a process or a hardware module for performing an electrical analysis in some embodiments.

FIG. 6A illustrates more details about a process or a hardware module for performing an electrical analysis in some embodiments. More specifically, FIG. 6A illustrates more details about the processes or hardware module for handing off the results of the physical module creation session(s) for layout or verification such as 312, the process or hardware module for performing the one or more electrical analyses such as 408A or 408B. More specifically, FIG. 6A illustrates a flow diagram where the method or the system may utilize or comprise a computing system to perform certain actions that comprise the respective process or hardware module 604A of identifying, determining, or updating physical data of one or more physical modules or at least a partial layout associated with the one or more physical modules.

In some embodiments, the method or the system may further comprise the respective process or hardware module for identifying, determining, or updating physical data of a physical module or any part of at least a partial layout of an electronic circuit physical design. In some embodiments, the method or system may further comprise the process or module for characterizing one or more electrical parasitics that are associated with the physical data 606A and the process or module of characterizing one or more electrical characteristics associated with the one or more electrical parasitics and physical data at 608A. In some embodiments, the method or the system may further comprise the respective process or hardware module of identifying or determining one or more constraints that are associated with the one or more characterized electrical characteristics at 610A. In some embodiments where the one or more constraints comprise an electro-migration (EM) related constraint, the one or more constraints may further comprise one or more limits on current densities for one or more nets, devices, or components. In some embodiments, the one or more EM related constraints may comprise one or more functions of the physical data, the electrical parasitics, or the combination thereof.

For example, an EM related constraint may be provided as a function of the geometric dimension, such as length or width, of an interconnect or via. For example, an EM related constraint may be provided as a function of via groups or arrays. For example, an EM related constraint may be provided as a function of the net attribute such as signal, power/ground. For example, an EM related constraint may be provided as a function of the duty or pulse characteristics of a particular signal. In some embodiments, the other data related to the one or more EM related constraints comprise, for example but not limited to reliability of the component related to the physical data or of the electronic circuit, power supply integrity, etc. In these embodiments where one or more EM related constraints are identified or determined, the method or the system for implementing electronic circuit designs with electro-migration awareness may further comprise the process or module of ensuring correctness of the physical data or other data related to the one or more EM related constraints at 612A. In addition or in the alternative, the one or more constraints may further comprise a voltage drop (IR-drop) related constraint or any other constraints related to the electronic design.

Figure 6B:
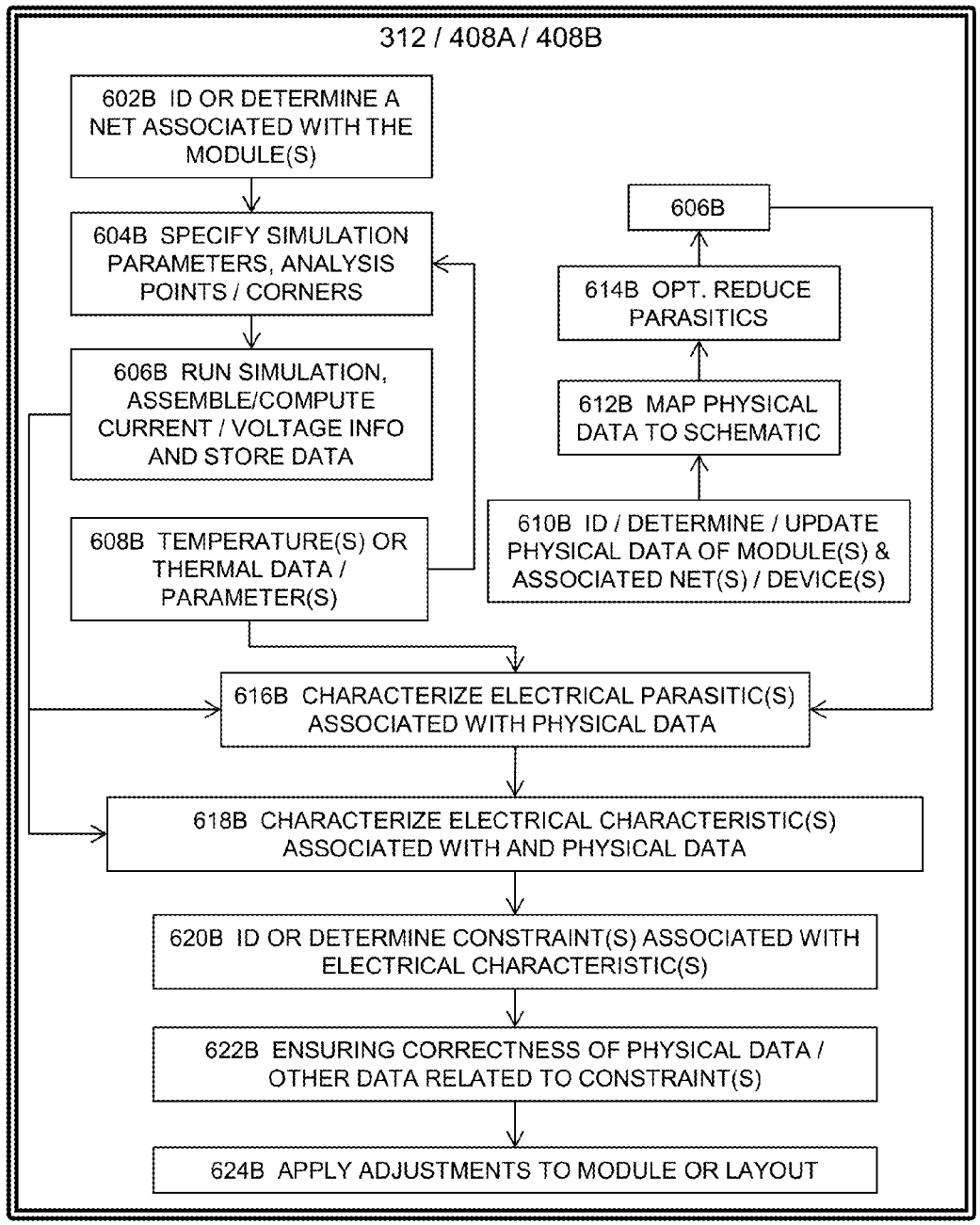
FIG. 6B illustrates more details about a process or a hardware module for performing an electrical analysis in some embodiments.

FIG. 6B illustrates more details about a process or a hardware module for performing an electrical analysis in some embodiments. FIG. 6B illustrates more details about the processes or hardware module for handing off the results of the physical module creation session(s) for layout or verification such as 312, the process or hardware module for performing the one or more electrical analyses such as 408A or 408B. The method or the system may further comprise the respective process or hardware module 604B for identifying or specifying one or more simulation parameters or analysis points or corners for the simulation(s) and the respective process or hardware module of invoking one or more simulators at 606B to perform simulation(s) at the schematic level to determine, for example, the current and voltage for each terminal of a device in some embodiments.

In some embodiments, the process or module at 604B may optionally comprise separating the nets into power nets and signal nets. The process or module may then use, for example, a transistor level simulator to perform simulations for the signal net(s) and a matrix solver to solve for the currents, voltages, etc. for the power or ground nets because the power or ground nets are usually larger than the signal nets and thus may contain many resistors and capacitors and further because the power or ground nets usually carry sufficiently constant currents such that the EM analysis of the power or ground nets may be adequately ascertained by using a DC current density. In some embodiments, the process or method may further comprise the respective process or hardware module 608B of identifying or determining temperature or thermal data and imparting the temperature or thermal data into the process or module of specifying one or more simulation parameters, one or more analysis corners, or one or more corners at 604B based on the imparted temperature or thermal data.

For example, the method or the system may identify or determine the maximum or average operating temperature via, for example device environmental specification, a Joule heating model, or a heat transfer model, for an interconnect segment, use the temperature to more accurately determine the electrical resistivity which is in turn used to more accurately determine the electrical resistance of the interconnect segment. At 606B, the method or the system may further comprise the respective process or hardware module 606B of assembling and providing the electrical characteristics, such as the currents (e.g., the RMS currents, peak currents, average currents) or voltages, to the physical design in some embodiments. In some embodiments, the method or the system may further store the results of the simulation.

Once the method or the system finishes processing at 606B, the method or the system may proceed to 616B of characterizing one or more electrical parasitics that are associated with the physical data in some embodiments or to 6188 of characterizing the electrical characteristics that are associated with the physical data in some other embodiments. For example, the process or module may comprise using a plurality of resistance parasitics to construct an electrical conductance matrix (G) at 616B in some embodiments. In this example, the electrical conductance matrix comprises elements each of which constitutes the reciprocal of a resistance of, for example, a segment of an interconnect. The electrical conductance matrix (G) may be arranged in any manner that is suitable for solving for the electrical behavior or various electrical characteristics for the portion of an electronic circuit design of interest. For example, the electrical conductance matrix (G) may be arranged in a manner such that the portion of the electronic circuit may be solved under the Kirchhoff's junction rule (or the Kirchhoff's current law or KCL).

In some embodiments, the process or module 618B may comprise using a linear solver for voltages or currents of a net, device, or component in some embodiments. The process or module 618B may further comprise the use of the solved voltages and subsequent algebraic calculations using Ohm's law to determine the current(s) in each wire segment as well as the geometry of the wire segment to acquire or compute current(s) or voltage(s), or with additional computation, current density (or densities) of a net, device, or component in some embodiments. More details about the process or hardware module 618B will be described in greater details in some of the subsequent paragraphs with reference to FIG. 7A.

In some embodiments, the method or the system may comprise the process or hardware module 620B for identifying or determining one or more constraints associated with the one or more electrical characteristics that have been characterized at 618B. In some embodiments, the one or more constraints comprise one or more EM related constraints that may further comprise one or more limits on current densities for one or more nets, devices, or components. In some embodiments, the one or more EM related constraints may comprise one or more functions of the physical data, the electrical parasitics, or the combination thereof. For example, an EM related constraint may be provided as a function of the geometric dimension, such as length or width, of an interconnect or via. For example, an EM related constraint may be provided as a function of via groups or arrays.

For example, an EM related constraint may be provided as a function of the net attribute such as signal, power or ground. For example, an EM related constraint may be provided as a function of the duty or pulse characteristics of a particular signal. In some embodiments, the other data related to the one or more EM related constraints comprise, for example but not limited to reliability of the component related to the physical data or of the electronic circuit, power supply integrity, etc. In these embodiments where one or more EM related constraints are identified or determined, the method or the system for implementing electronic circuit designs with electro-migration awareness may further comprise the process or module of ensuring correctness of the physical data or other data related to the one or more EM related constraints at 210. More information about the processes and modules involving the identification or determination of one or more EM related constraints and ensuring the correctness of the physical data or other data related to the one or more EM related constraints will be described in further details in subsequent paragraphs with reference to various figures.

In addition or in the alternative, the one or more constraints may comprise one or more constraints on the voltage drops or other constraints that may be associated with the electrical characteristics of an electronic design. In some embodiments, the method or the system may also comprise the respective process or hardware module 622B of ensuring correctness of the physical data or other data that are related to the one or more constraints that are identified or determined at 620B. In some of these embodiments, the method or the system may comprise the relevant information or data, such as the one or more electrical characteristics characterized at 618B, with the one or more corresponding constraints that are identified or determined at 620B to determine whether the relevant information or data satisfy the one or more corresponding constraints.

In some embodiments, the method or the system may also comprise the respective process or hardware module 624B of identifying, determining, or applying one or more adjustments to the physical module or at least a partial layout associated with the physical module or at least a partial layout that is associated with the physical module. In some embodiments, the method or the system may determine the effects of the adjustments to be applied before these adjustments are applied and provide guidance to a designer as to whether or how each of the one or more adjustments may affect the electronic design.

Figure 7A:
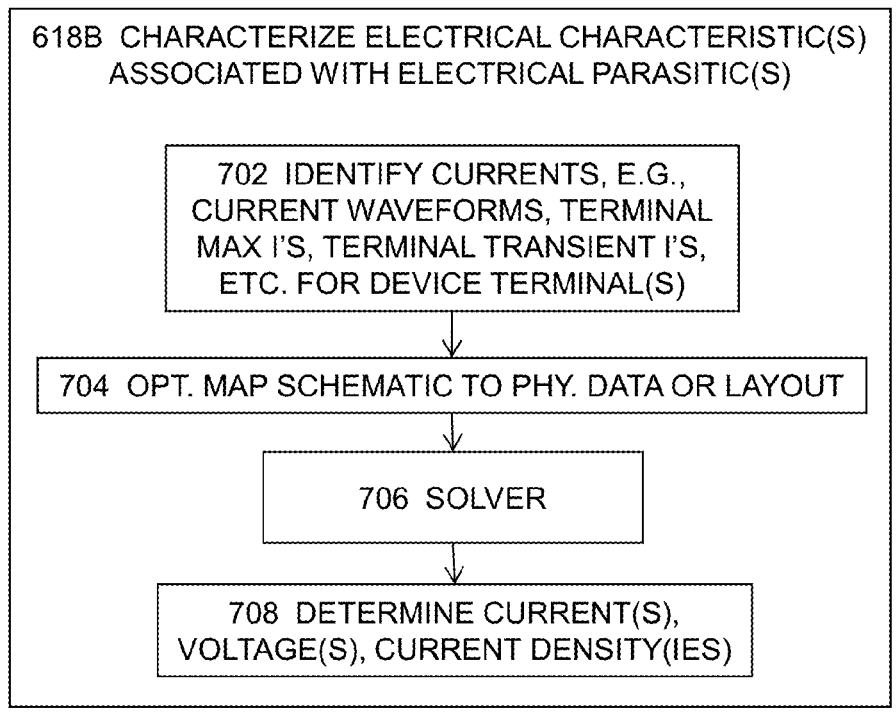
FIG. 7A illustrates more details about a process or a hardware module for characterizing an electrical characteristic associated with an electrical parasitic in some embodiments.

FIG. 7A illustrates more details about a process or a hardware module for characterizing an electrical characteristic associated with an electrical parasitic in some embodiments. More specifically, FIG. 7A illustrates more details about the process or module 618B for characterizing one or more electrical characteristics that are associated with one or more electrical parasitics in some embodiments. In some embodiments, the process or module 618B may comprise the respective process or hardware module 702 of identifying one or more electrical currents.

In some embodiments, the one or more currents may comprise, for example but not limited to, one or more current waveforms at various time points, one or more maximum currents at terminal(s), pins(s), or node(s), transient currents, root mean square currents, etc. In some embodiments, the process or module 618B may further optionally comprise the respective process or hardware module 704 of mapping electrical data in the schematic domain to the physical domain. For example, the process or module 106 may map the currents or voltages identified or determined at the schematic level simulation to the physical data or layout to impart such schematic level data or results into a linear solver in order for the linear solver to determine the currents, voltages, or current densities in the physical domain. At 706, the process or module 618B may further optionally comprise the respective process or hardware module 706 of transfer the mapped electrical data to a solver and the respective process or hardware module 708 for determining the one or more electrical characteristics such as various forms of electrical currents, voltages, current densities, etc. by using the solver.

Figure 7B:
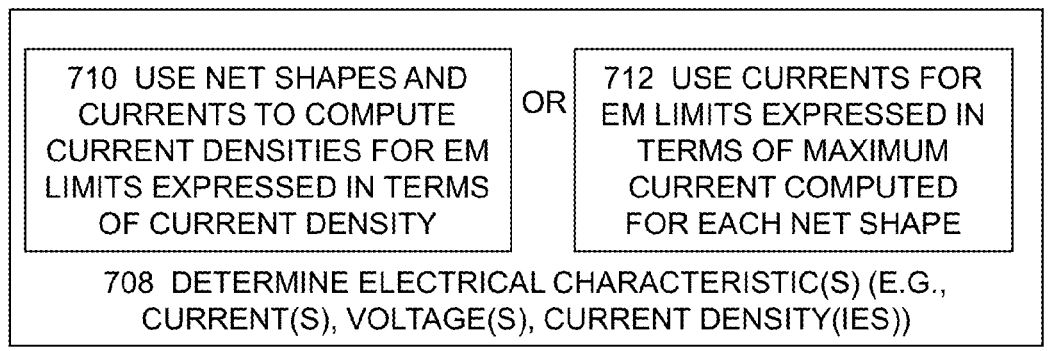
FIG. 7B illustrates more details about a process or a hardware module for determining electrical data in some embodiments.

FIG. 7B illustrates more details about a process or a hardware module for determining electrical data in some embodiments. More specifically, FIG. 7B illustrates more details about the process or module 708 for determining the one or more electrical characteristics in some embodiments. In some embodiments, the process or module 708 may comprise the respective process or hardware module 710 for using one or more net shapes and one or more associated currents to determine current densities for EM constraints that are expressed in terms of current density. In addition or in the alternative, the process or module 708 may comprise the respective process or hardware module 712 for using one or more electrical currents for EM constraints that are expressed in terms of maximum currents determined for each of a plurality of net shapes. In these embodiments, the constraints comprise EM related constraints. In addition or in the alternative, the process or hardware module 708 may further use various forms of electrical currents or voltages for IR-drop related constraints or limits or any other constraints that may be similarly characterized.

Figure 7C:
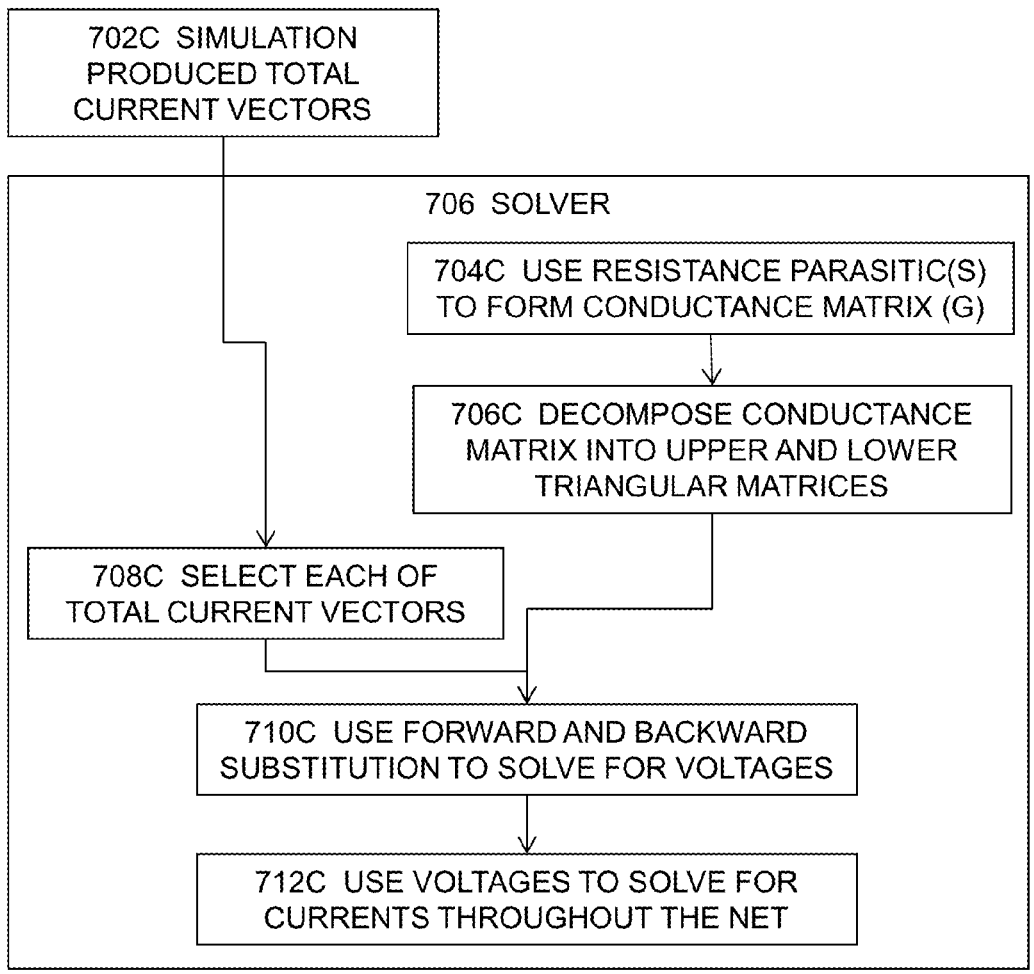
FIG. 7C illustrates more details about a solver in some embodiments.

FIG. 7C illustrates more details about a solver in some embodiments. At 704C, the process or module comprises using a plurality of resistance parasitics to construct an electrical conductance matrix (G) in some embodiments. The electrical conductance matrix comprises elements each of which constitutes the reciprocal of a resistance of, for example, a segment of an interconnect. The electrical conductance matrix (G) may be arranged in any manner that is suitable for solving for the electrical behavior or various electrical characteristics for the portion of an electronic circuit design of interest. For example, the electrical conductance matrix (G) may be arranged in a manner such that the portion of the electronic circuit may be solved under the Kirchhoff's junction rule (or the Kirchhoff's current law or KCL).

At 706C, the process or module comprises decomposing the electrical conductance matrix into an upper triangular matrix and a lower triangular matrix in some embodiments. In some embodiments where the electrical conductance matrix constitutes a positive definite and symmetric matrix, the process or module may invoke, for example, some direct methods such as the Cholesky-based techniques or the LU decomposition techniques to decompose the electrical conductance matrix into the lower triangular matrix and the upper triangular matrix. In some other embodiments, the process or the module may invoke other numerical techniques such as the conjugate gradient method or the bi-conjugate gradient method to achieve substantially the same purpose. The solver 706 may then proceed to 710C. At 708C, the process or module further comprises selecting one of these current vectors that are previously identified in some embodiments. In some embodiments, the method or the system may further comprise the respective process or module 702C of providing simulation produced total current vectors to the respective process or module 708C for selecting each of a plurality of current vectors. The solver 706 may then proceed to 710C.

Upon the selection of each of the current vectors at 708C and the decomposition of the electrical conductance matrix (G) at 706C, the process or module may then use, for example, forward substitution and backward substitution to solve for voltages for the portion of the electronic circuit design at 710C in some embodiments. At 712C, the process or module may then use the voltages to solve for currents that flow through the physical module or at least a partial layout for the current vector that is selected or identified at 708C in some embodiments. In one or more embodiments, the process or module may comprise identifying or determining one or more proper EM related constraints that are associated with the electrical characteristics.

Figure 7D:
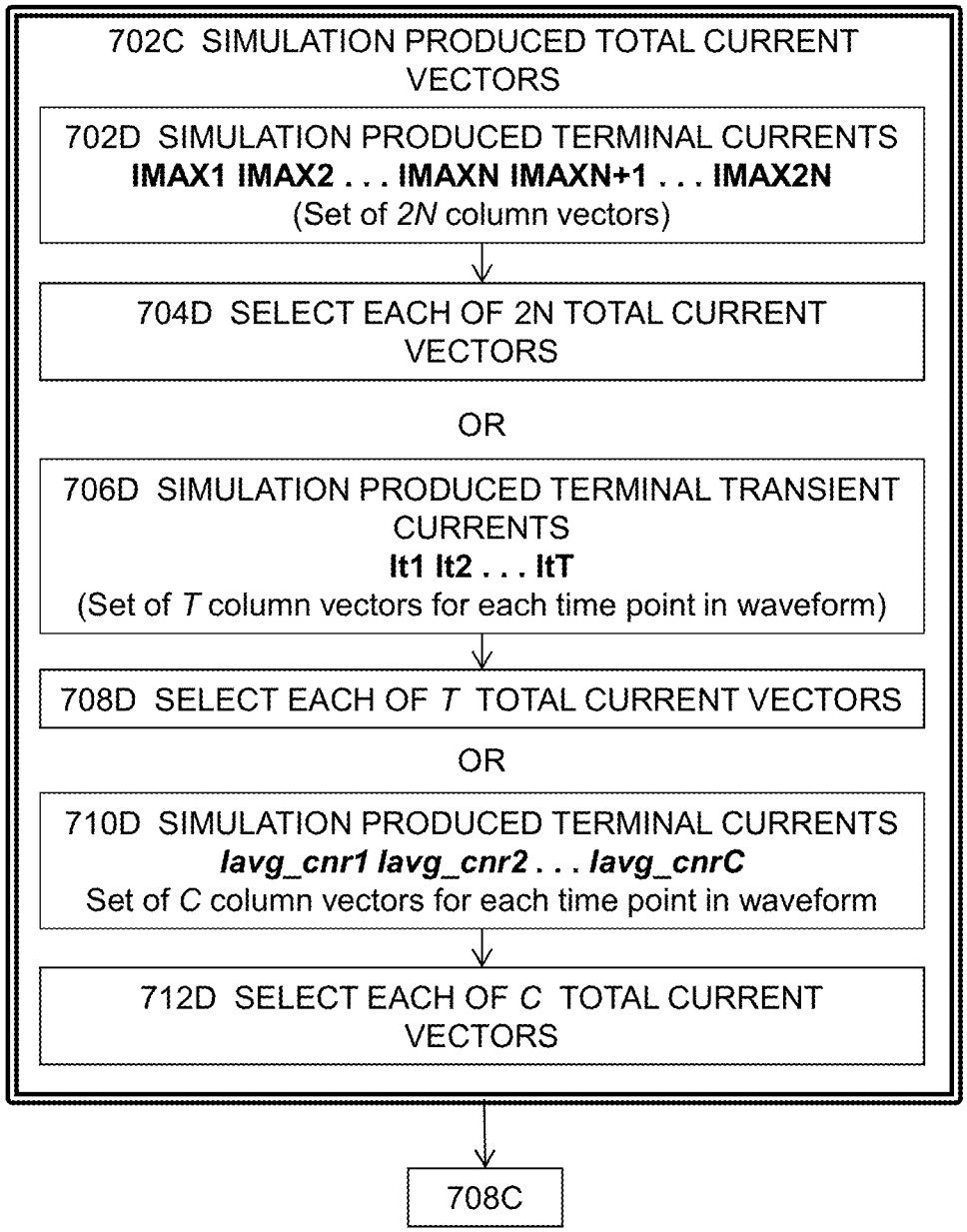
FIG. 7D illustrates more details about some exemplary simulation produced current vectors in some embodiments.

FIG. 7D illustrates more details about some exemplary simulation produced current vectors in some embodiments. In some embodiments, the process or hardware module 702C may comprise identifying a set of 2N current column vectors (IMAX1, IMAXN2, . . . , IMAXN, IMAXN+1 . . . IMAX2N) for a total of N or 2N terminals from one or more simulations at 702D. In some embodiments where the currents are bi-directional, both the positive maximum current and the maximum negative current are examined for each of the N terminals, and thus there are 2N column vectors for the 2N currents at these N terminals.

In some embodiments where the electrical currents are uni-directional such as in the cases where one or more signal nets are identified as the components for EM analysis, the process or module examines the maximum current at each terminal, and thus there are 2N column current vectors for 2N terminals in these embodiments. At 704D, the process or module further comprises selecting one of these 2N current vectors that are identified at 702D in some embodiments. In some embodiments, the process or hardware module 706D comprises the respective process or hardware module for identifying or determining a set of T column vectors (It1, It2 . . . ItT) at each of a set of time points in a waveform. The method or the system may then proceed to invoke the solver to identify or select one of the T column current vectors at 708D in some embodiments.

In some embodiments, the process or hardware module 702C may comprise the respective process or hardware module 710D of identifying or determining a set of C column current vectors (lavg_cnr1, lavg_cnr1 . . . lavg_cnrC) that represent an average current vector for each of C corner values. The process or hardware module 702C may further comprise the respective process or hardware module 712D for identifying or selecting a column current vector from the set of C column current vectors.

Figure 8:
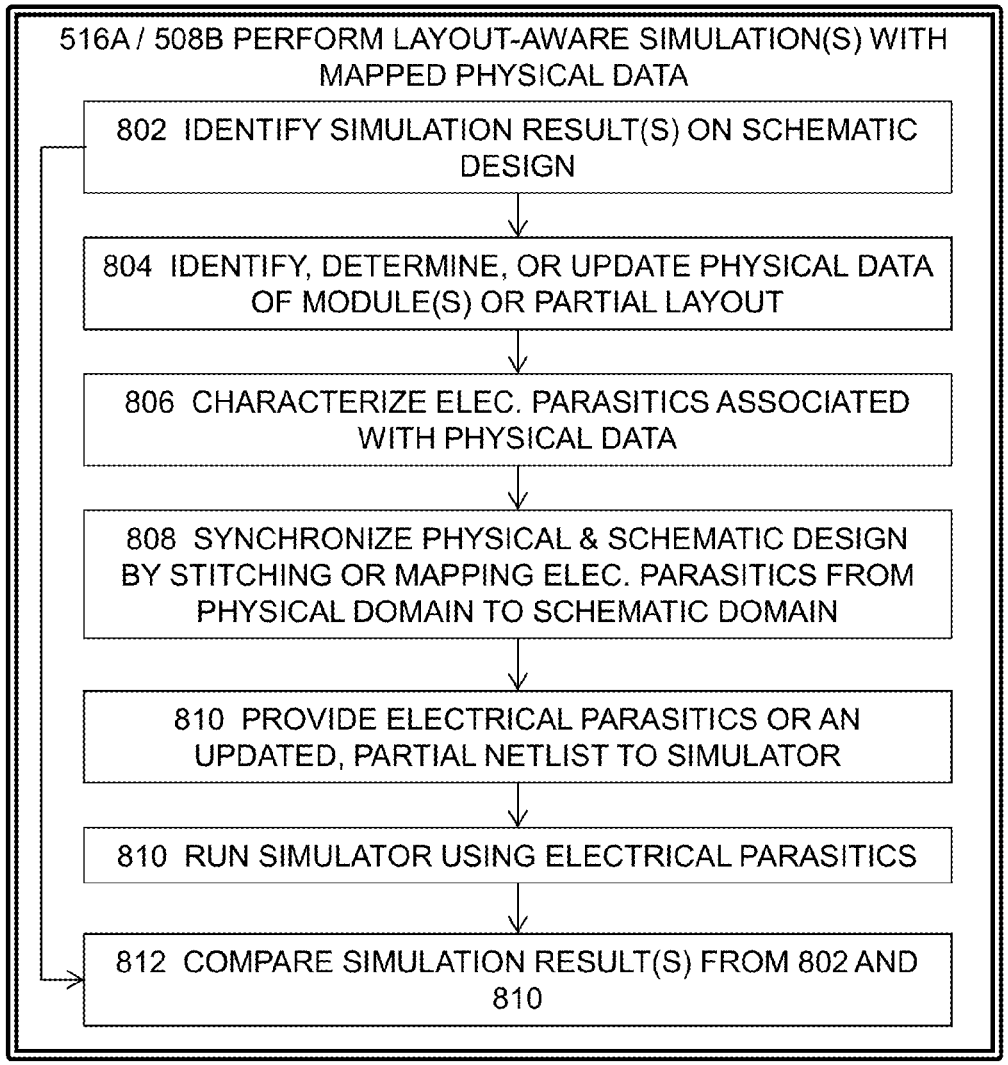
FIG. 8 illustrates more details about the process or module for performing electrically-aware simulation(s) in some embodiments.

FIG. 8 illustrates more details about the process or module for performing electrically-aware simulation(s) in some embodiments. More specifically, FIG. 8 illustrates more details about the process or module for performing one or more layout-aware simulation with mapped physical data such as 516A or 5088 in some embodiments. In some embodiments, the process or module of performing one or more layout-aware simulations may comprise the respective process or module 802 for identifying one or more simulation results on the schematic design. In some embodiments, the process or module of performing one or more layout-aware simulations may comprise the respective process or module 804 for identifying, determining, or updating the physical data of one or more physical modules or at least a partial layout associated with the one or more physical modules.

In some embodiments, the process or module of performing one or more layout-aware simulations may comprise the respective process or module 806 for characterizing one or more electrical parasitics associated with the physical data. In some embodiments, the process or module of performing one or more layout-aware simulations may comprise the respective process or module 808 for synchronizing the physical design (e.g., a physical module or the at least a partial layout associated with the physical module) and the corresponding schematic design. In some embodiments, the process or module 808 may be performed by stitching one or more electric parasitics from the physical domain to the schematic domain.

In addition or in the alternative, the process or module 808 may be performed by mapping one or more electrical parasitics from the physical domain to the schematic domain such as from a physical namespace to a schematic namespace. In some embodiments, at least some of the one or more electrical parasitics may be first transformed or converted to the standard parasitic exchange format (SPEF). In some embodiments, the process or module of performing one or more layout-aware simulations may comprise the respective process or module 810 for providing the one or more electrical parasitics or an updated partial netlist to a simulator in the schematic domain.

In some embodiments, the process or module of performing one or more layout-aware simulations may comprise the respective process or module 810 for performing one or more simulations using the one or more electrical parasitics that have been mapped or stitched or annotated in the schematic domain. In some embodiments, the process or module of performing one or more layout-aware simulations may comprise the respective process or module 812 for comparing the results of the one or more simulations at 810 and the one or more simulation results identified at 802. It shall be noted that various processes or hardware modules illustrated in FIG. 8 may be invoked and performed at any point in time during the schematic design stage. In other words, various processes or hardware modules may be invoked and performed when a portion of the schematic design (e.g., a schematic instance of a module) is being created or when the entire schematic is complete and is currently undergoing some modifications.

Figure 9:
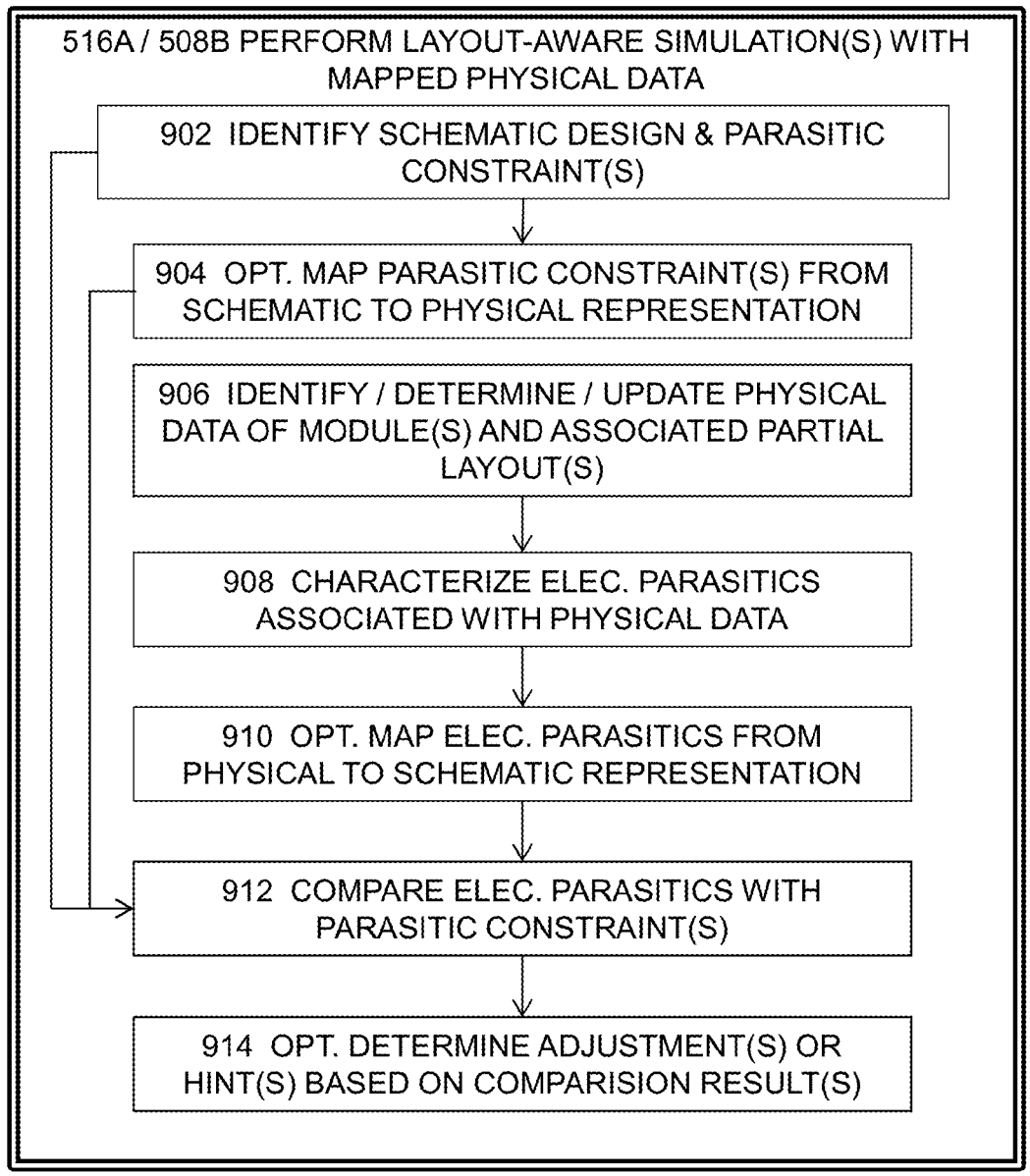
FIG. 9 illustrates more details about the process or module for performing electrically-aware simulation(s) in some embodiments.

FIG. 9 illustrates more details about the process or module for performing electrically-aware simulation(s) in some embodiments. More specifically, FIG. 9 illustrates more details about the process or module for performing one or more layout-aware simulation with mapped physical data such as 516A or 5088 in some embodiments. In some embodiments, the process or module of performing one or more layout-aware simulations may comprise the respective process or module 902 for identifying or creating a schematic design and one or more constraints such as but not limited to one or more parasitic constraints. The process or module 902 may directly proceed to 912 or in the alternative to 904 and then to 912.

In some embodiments, the process or module of performing one or more layout-aware simulations may comprise the respective process or module 904 for optionally mapping the one or more constraints form the schematic representation to the physical representation. In some embodiments, the process or module of performing one or more layout-aware simulations may comprise the respective process or module 906 for identifying, determining, or updating the physical data of a physical module or at least a partial layout associated with the physical module. The method or the system may then characterize one or more electrical parasitics associated with the physical data at 908 in some embodiments. In some embodiments, the process or module of performing one or more layout-aware simulations may further optionally comprise the respective process or module 910 for mapping the one or more parasitics from the physical to the schematic representation.

In some embodiments, at least some of the one or more parasitics may be first transformed or converted to the standard parasitic exchange format (SPEF) before at least some of the one or more parasitics are mapped from the physical design representation to the schematic design representation.

In some embodiments, the process or module of performing one or more layout-aware simulations may comprise the respective process or module 912 for comparing the one or more electrical parasitics with the corresponding one or more parasitic constraints to determine whether the corresponding parasitic constraints are satisfied. In some embodiments, the process or module of performing one or more layout-aware simulations may optionally comprise the respective process or module 914 for determining one or more adjustments or one or more hints for candidate adjustments based at least in part upon the comparison results generated by 912. A designer may use the one or more hints as guidance to fix or improve the electronic design. The method or the system may further perform at least some of the one or more adjustments automatically or in an assisted manner with input from a designer.

System Architecture Overview

FIG. 1 illustrates a block diagram of an illustrative computing system 100 suitable for implementing some embodiments of the method or system for implementing electronic circuit designs with electro-migration awareness as described in the preceding paragraphs with reference to various figures. Computer system 100 includes a bus 106 or other communication mechanism for communicating information, which interconnects subsystems and devices, such as processor 107, system memory 108 (e.g., RAM), static storage device 109 (e.g., ROM), disk drive 110 (e.g., magnetic or optical), communication interface 114 (e.g., modem or Ethernet card), display 111 (e.g., CRT or LCD), input device 112 (e.g., keyboard), and cursor control (not shown).

According to one embodiment, computer system 100 performs specific operations by one or more processor or processor cores 107 executing one or more sequences of one or more instructions contained in system memory 108. Such instructions may be read into system memory 108 from another computer readable/usable storage medium, such as static storage device 109 or disk drive 110. In alternative embodiments, hard-wired circuitry may be used in place of or in combination with software instructions to implement the invention. Thus, embodiments of the invention are not limited to any specific combination of hardware circuitry and/or software. In one embodiment, the term "logic" shall mean any combination of software or hardware that is used to implement all or part of the invention.

Various actions or processes as described in the preceding paragraphs may be performed by using one or more processors, one or more processor cores, or combination thereof 107, where the one or more processors, one or more processor cores, or combination thereof executes one or more threads. For example, the act of specifying various net or terminal sets or the act or module of performing verification or simulation, etc. may be performed by one or more processors, one or more processor cores, or combination thereof. In one embodiment, the parasitic extraction, current solving, current density computation and current or current density verification is done in memory as layout shapes or nets are created or modified.

The term "computer readable storage medium" or "computer usable storage medium" as used herein refers to any medium that participates in providing instructions to processor 107 for execution. Such a medium may take many forms, including but not limited to, non-volatile media and volatile media. Non-volatile media includes, for example, optical or magnetic disks, such as disk drive 110. Volatile media includes dynamic memory, such as system memory 108.

Common forms of computer readable storage media includes, for example, electromechanical disk drives (such as a floppy disk, a flexible disk, or a hard disk), a flash-based, RAM-based (such as SRAM, DRAM, SDRAM, DDR, MRAM, etc.), or any other solid-state drives (SSD), magnetic tape, any other magnetic or magneto-optical medium, CD-ROM, any other optical medium, any other physical medium with patterns of holes, RAM, PROM, EPROM, FLASH-EPROM, any other memory chip or cartridge, or any other medium from which a computer can read.

In an embodiment of the invention, execution of the sequences of instructions to practice the invention is performed by a single computer system 100. According to other embodiments of the invention, two or more computer systems 100 coupled by communication link 115 (e.g., LAN, PTSN, or wireless network) may perform the sequence of instructions required to practice the invention in coordination with one another.

Computer system 100 may transmit and receive messages, data, and instructions, including program, i.e., application code, through communication link 115 and communication interface 114. Received program code may be executed by processor 107 as it is received, and/or stored in disk drive 110, or other non-volatile storage for later execution. In an embodiment, the computer system 100 operates in conjunction with a data storage system 131, e.g., a data storage system 131 that contains a database 132 that is readily accessible by the computer system 100. The computer system 100 communicates with the data storage system 131 through a data interface 133. A data interface 133, which is coupled to the bus 106, transmits and receives electrical, electromagnetic or optical signals that include data streams representing various types of signal information, e.g., instructions, messages and data. In embodiments of the invention, the functions of the data interface 133 may be performed by the communication interface 114.

In the foregoing specification, the invention has been described with reference to specific embodiments thereof. It will, however, be evident that various modifications and changes may be made thereto without departing from the broader spirit and scope of the invention. For example, the above-described process flows are described with reference to a particular ordering of process actions. However, the ordering of many of the described process actions may be changed without affecting the scope or operation of the invention. The specification and drawings are, accordingly, to be regarded in an illustrative rather than restrictive sense.

We claim:

1. A computer implemented method for implementing analysis-driven module creation for an electronic design, comprising:
using at least one processor to perform a process the process comprising:
identifying or receiving schematic electrical information from a result of schematic simulation generated by a schematic simulator for the electronic design;
transferring the schematic electrical information in a schematic domain to a physical module creation or modification session; and
performing a physical module creation or modification process in a physical domain for a physical module of the electronic design in the physical module creation or modification session by using at least the schematic electrical information while running the schematic simulation with updated physical data from the physical module creation or modification process to update the result of schematic simulation, wherein the schematic simulator is made aware of the physical implementation by using at least physical data identified from an incomplete physical design in the physical domain to generate the schematic electrical information.

2. The computer implemented method of claim 1, the process further comprising:
handing off a module created by the physical module creation session to a physical design or verification process.

3. The computer implemented method of claim 1, the process further comprising:
identifying a parameter, wherein the parameter corresponds to the physical module or the physical module creation session;
identifying or determining electrical data for the at least the partial layout; and
extracting parasitic data or physical data for the at least the partial layout.

4. The computer implemented method of claim 3, the physical module creation process comprising at least one of:
generating the physical module for the electronic design based at least in part upon the parameter;
editing or modifying the physical module for the electronic design by using at least the parameter, wherein the physical module already exists prior to performance of the module creation process; and
performing one or more simulations in a schematic domain or in a physical domain in addition to a schematic simulation that produces the schematic simulation result.

5. The computer implemented method of claim 3, the action of generating the physical module for the electronic design comprises at least one of:
performing a physical layout process for the physical module in at least a partial layout of the electronic design based at least in part upon the parameter, the physical layout process comprises floorplanning, placement, or at least partial routing for the physical module; and
identifying a layout alternative for the physical module and using the layout alternative for the physical module to generate the at least the partial layout of the electronic design, wherein the layout alternative is predetermined prior to the act of performing the physical module creation process.

6. The computer implemented method of claim 3, the process further comprising:
performing an electrical analysis using at least the parasitic data or the physical data; and
performing a fix for the physical module based at least in part upon an electrical analysis result.

7. The computer implemented method of claim 6, the process further comprising:
reconfiguring the physical module based at least in part upon the fix for the physical module.

8. The computer implemented method of claim 3, the action of identifying or determining the electrical data for the at least the partial layout comprising:
mapping the schematic electrical information from the schematic simulation result to the physical domain by transforming the schematic electrical information from the schematic simulation result in a schematic namespace to a physical namespace in the physical domain.

9. The computer implemented method of claim 3, the process further comprising:
mapping at least some of the physical data or the parasitic data from the physical domain to a schematic domain;
transferring the at least some of the physical data or the parasitic data, which have been mapped to the schematic domain, to the schematic simulator; and
re-performing the schematic simulation by using the at least some physical data or the parasitic data, which have been mapped.

10. The computer implemented method of claim 9, the action of re-performing the schematic simulation comprises:
identifying the result of schematic simulation that is generated by the schematic simulator and is related to the at least some of the physical data;
identifying, determining, or updating the at least some of the at least some of the physical data based at least in part upon the result of the schematic simulation;
characterizing an electrical parasitic that is associated with the at least some of the physical data; and
re-performing the schematic simulation by using at least a transformed version of the electrical parasitic.

11. The computer implemented method of claim 9, the action of re-performing the schematic simulation comprises:
synchronizing at least a partial physical design including the physical module and at least a schematic version of the partial physical design by transforming the electrical parasitic into the transformed version of the electrical parasitic in the schematic version; and
providing the transformed version of the electrical parasitic to the schematic simulator.

12. The computer implemented method of claim 11, the action of re-performing the schematic simulation comprises:
comparing a result of the action of re-performing the schematic simulation with the result of schematic simulation; and
determining an adjustment to the partial physical design based at least in part upon a comparison result of the action of comparing.

13. The computer implemented method of claim 3, wherein the action of performing the electrical analysis comprises:
identifying, determining, or updating physical data of or related to a partial layout including the physical module;
characterizing an electrical parasitic that is associated with the physical data;
characterizing an electrical characteristic that is associated with the electrical parasitic or the physical data; and
identifying or determining a constraint that is associated with the electrical characteristic.

14. The computer implemented method of claim 13, in which the action of performing the electrical analysis is performed during the module creation session.

15. The computer implemented method of claim 13, in which the act of performing the electrical analysis further comprises:
ensuring correctness of the physical data or other data that are related to the constraint.

16. The computer implemented method of claim 15, the act of performing the electrical analysis further comprising:
identifying or determining a net that is associated with the partial layout;
specifying a simulation parameter, an analysis point, or an analysis corner that is associated with the net; and
determining electrical data for the net by at least performing a simulation in the physical domain.

17. The computer implemented method of claim 16, the action of performing the electrical analysis further comprising:
identifying thermal data associated with the partial layout; and updating the simulation parameter, the analysis point, or the analysis corner by using at least the thermal data.

18. The computer implemented method of claim 16, the action of identifying, determining, or updating the physical data of or related to the partial layout including the physical module comprising:
reducing a total number of electrical parasitics to a first number of electrical parasitics, in which the total number is greater than the first number; and
mapping the physical data to the schematic domain.

19. The computer implemented method of claim 18, the action of identifying, determining, or updating the physical data of or related to the partial layout including the physical module comprising:
determining an adjustment to the physical data or the other data that are related to the constraint based at least in part upon a result of the action of ensuring the correctness of the physical data or the other data that are related to the constraint;
applying the adjustment to the physical data or the other data that are related to the constraint; and
ensuring the correctness of the physical data or other data that are related to the constraint based at least in part upon the adjustment.

20. The computer implemented method of claim 13, in which the action of characterizing the electrical characteristic that is associated with the electrical parasitic or the physical data further comprises:
identifying current information for the partial layout; and
determining the electrical characteristic by using at least the current information and a solver process.

21. The computer implemented method of claim 20, in which the action of determining the electrical characteristic by using at least the current information and the solver process comprises at least one of:
determining whether an electro-migration related constraint is satisfied by determining a current density or a current for a shape by using the shape and the current information; and
determining whether a voltage drop related constraint is satisfied by determining a first current for a first shape by using the shape and the current information.

22. The computer implemented method of claim 20, in which the solver process comprises:
identifying or receiving the current information for the partial layout;
determining one or more voltages for the partial layout by using at least the current information; and
determining one or more current data for the partial layout by using at least the one or more voltages for the partial layout.

23. The computer implemented method of claim 22, in which the current comprises at least one of:
a maximum current or a maximum current vector in the partial layout;
a transient current or a transient current vector at a first time point of a first plurality of time points in the partial layout; and
an average current or an average current vector at a second time point of a second plurality of time points in the partial layout.

24. An article of manufacture comprising a non-transitory computer accessible memory storing thereupon a sequence of instructions which, when executed by at least one processor, causes the at least one processor to perform a method for implementing analysis-driven module creation for an electronic design, the method comprising:
using the at least one processor to perform a process the process comprising:
identifying or receiving schematic electrical information from a result of schematic simulation generated by a schematic simulator for the electronic design;
transferring the schematic electrical information in a schematic domain to a physical module creation or modification session; and
performing a physical module creation or modification process in a physical domain for a physical module of the electronic design in the physical module creation or modification session by using at least the schematic electrical information while running the schematic simulation with updated physical data from the physical module creation or modification process to update the result of schematic simulation, wherein
the schematic simulator is made aware of the physical implementation by using at least physical data identified from an incomplete physical design in the physical domain to generate the schematic electrical information.

25. The article of manufacture of claim 24, in which the process further comprises:
identifying a parameter, wherein the parameter corresponds to the physical module or the physical module creation session;
identifying or determining electrical data for the at least the partial layout; and
extracting parasitic data or physical data for the at least the partial layout.

26. The article of manufacture of claim 25, the physical module creation process comprising at least one of:
generating the physical module for the electronic design based at least in part upon the parameter;
editing or modifying the physical module for the electronic design by using at least the parameter, wherein the physical module already exists prior to performance of the module creation process; and
performing one or more simulations in a schematic domain or in a physical domain in addition to a schematic simulation that produces the schematic simulation result.

27. The article of manufacture of claim 25, the act of generating the physical module for the electronic design comprises at least one of:
performing a physical layout process for the physical module in at least a partial layout of the electronic design based at least in part upon the parameter, the physical layout process comprises floorplanning, placement, or at least partial routing for the physical module; and
identifying a layout alternative for the physical module and using the layout alternative for the physical module to generate the at least the partial layout of the electronic design, wherein the layout alternative is predetermined prior to the act of performing the physical module creation process.

28. The article of manufacture of claim 25, the process further comprising:
performing an electrical analysis using at least the parasitic data or the physical data;
performing a fix for the physical module based at least in part upon an electrical analysis result; and
reconfiguring the physical module based at least in part upon the fix for the physical module.

29. The article of manufacture of claim 25, the process further comprising:
mapping at least some of the physical data or the parasitic data from the physical domain to a schematic domain;

transferring the at least some of the physical data or the parasitic data, which have been mapped to the schematic domain, to the schematic simulator; and re-performing the schematic simulation by using the at least some physical data or the parasitic data, which have been mapped.

30. The article of manufacture of claim 25, the act of performing the electrical analysis comprises:

identifying, determining, or updating physical data of or related to a partial layout including the physical module;

characterizing an electrical parasitic that is associated with the physical data;

characterizing an electrical characteristic that is associated with the electrical parasitic or the physical data; and identifying or determining a constraint that is associated with the electrical characteristic.

31. A system for implementing analysis-driven module creation for an electronic design, comprising:

at least one processor that is at least to:

identify or receive schematic electrical information from a result of schematic simulation generated by a schematic simulator for the electronic design;

transfer the schematic electrical information in a schematic domain to a physical module creation or modification session; and perform a physical module creation or modification process in a physical domain for a physical module of the electronic design in the physical module creation or modification session by using at least the schematic electrical information while running the schematic simulation with updated physical data from the physical module creation or modification process to update the result of schematic simulation, wherein the schematic simulator is made aware of the physical implementation by using at least physical data identified from an incomplete physical design in the physical domain to generate the schematic electrical information.

32. The system of claim 31, in which the at least one processor that is further to:

identify a parameter, wherein the parameter corresponds to the physical module or the physical module creation session;

identify or determine electrical data for the at least the partial layout; and extract parasitic data or physical data for the at least the partial layout.

33. The system of claim 32, in which the at least one processor that is at least to perform the physical module creation process is further to:

generate the physical module for the electronic design based at least in part upon the parameter;

edit or modify the physical module for the electronic design by using at least the parameter, wherein the physical module already exists prior to performance of the module creation process; and perform one or more simulations in a schematic domain or in a physical domain in addition to a schematic simulation that produces the schematic simulation result.

34. The system of claim 32, in which the at least one processor that is at least to generate the physical module for the electronic design is further to:

perform a physical layout process for the physical module in at least a partial layout of the electronic design based at least in part upon the parameter, the physical layout process comprises floorplanning, placement, or at least partial routing for the physical module; or identify a layout alternative for the physical module and using the layout alternative for the physical module to generate the at least the partial layout of the electronic design, wherein the layout alternative is predetermined prior to the act of performing the physical module creation process.

35. The system of claim 32, wherein the at least one processor that is further to:

perform an electrical analysis using at least the parasitic data or the physical data;

perform a fix for the physical module based at least in part upon an electrical analysis result; and reconfigure the physical module based at least in part upon the fix for the physical module.

36. The system of claim 32, wherein the at least one processor that is further to:

map at least some of the physical data or the parasitic data from the physical domain to a schematic domain;

transfer the at least some of the physical data or the parasitic data, which have been mapped to the schematic domain, to the schematic simulator; and re-perform the schematic simulation by using the at least some physical data or the parasitic data, which have been mapped.

37. The system of claim 32, wherein the at least one processor that is to perform the electrical analysis is further to:

identify, determine, or update physical data of or related to a partial layout including the physical module;

characterize an electrical parasitic that is associated with the physical data;

characterize an electrical characteristic that is associated with the electrical parasitic or the physical data; and identify or determine a constraint that is associated with the electrical characteristic.

* * * * *